United States Patent
Shinotake

(10) Patent No.: US 10,186,354 B2
(45) Date of Patent: Jan. 22, 2019

(54) MOUNTING STRUCTURE FOR MOUNTING SHUNT RESISTOR AND METHOD OF MANUFACTURING MOUNTING STRUCTURE FOR MOUNTING SHUNT RESISTOR

(71) Applicant: SHINDENGEN ELECTRIC MANUFACTURING CO., LTD., Chiyoda-ku, Tokyo (JP)

(72) Inventor: Yohei Shinotake, Saitama (JP)

(73) Assignee: SHINDENGEN ELECTRIC MANUFACTURING CO., LTD., Tokyo (JP)

(*) Notice: Subject to any disclaimer, the term of this patent is extended or adjusted under 35 U.S.C. 154(b) by 0 days.

(21) Appl. No.: 15/705,243

(22) Filed: Sep. 14, 2017

(65) Prior Publication Data

US 2018/0005733 A1  Jan. 4, 2018

Related U.S. Application Data

(63) Continuation-in-part of application No. PCT/JP2015/078032, filed on Oct. 2, 2015.

(51) Int. Cl.
  *H01C 1/14* (2006.01)
  *H05K 1/18* (2006.01)
  (Continued)

(52) U.S. Cl.
  CPC ............ *H01C 1/14* (2013.01); *G01R 15/00* (2013.01); *H01C 1/01* (2013.01); *H05K 1/181* (2013.01); *H05K 2201/10022* (2013.01)

(58) Field of Classification Search
  CPC ......... G01R 1/20; G01R 1/203; G01R 15/00; H01C 1/01; H01C 1/14; H05K 1/18;
  (Continued)

(56) References Cited

U.S. PATENT DOCUMENTS

| 2008/0265872 A1* | 10/2008 | Nagashima | G01R 1/203 324/126 |
| 2015/0245490 A1* | 8/2015 | Kondou | G01R 1/203 174/260 |
| 2017/0309555 A1* | 10/2017 | Shimakawa | H01C 1/14 |

FOREIGN PATENT DOCUMENTS

JP    2014-78538 A    5/2014

OTHER PUBLICATIONS

International Search Report in PCT/JP2015/078032, dated Dec. 15, 2015.

* cited by examiner

*Primary Examiner* — Timothy Thompson
*Assistant Examiner* — Guillermo Egoavil
(74) *Attorney, Agent, or Firm* — Hauptman Ham, LLP

(57) ABSTRACT

A mounting structure includes a PCB on which first and second conductive patterns are formed, and a shunt resistor mounted on one surface of a substrate via a conductive bonding material. Each of the first and second conductive patterns includes: a first/second lead-out portion and a first/second pull-out portion which is pulled out to the outside of a region of the shunt resistor from the first/second lead-out portion. A resistance value of the shunt resistor is detected between the first pull-out portion and the second pull-out portion. A bonding material flow-out preventing resist is disposed at a portion of a surface of at least one of the first lead-out portion and the second lead-out portion, and a fillet of the bonding material terminates at a position corresponding to a position where the bonding material flow-out preventing resist is disposed.

14 Claims, 15 Drawing Sheets

(51) Int. Cl.
*G01R 15/00* (2006.01)
*H01C 1/01* (2006.01)

(58) Field of Classification Search
CPC ........ H05K 1/111; H05K 1/181; H05K 3/222;
H05K 3/3421; H05K 2201/10022; H05K
2201/09281; H05K 2201/09381; H05K
2201/09909; H05K 2203/0465; H05K
2203/167; Y02P 70/611; Y02P 70/613
USPC ................ 361/321.2; 324/126; 338/325, 322
See application file for complete search history.

MOUNTING STRUCTURE FOR MOUNTING SHUNT RESISTOR AND METHOD OF MANUFACTURING MOUNTING STRUCTURE FOR MOUNTING SHUNT RESISTOR

RELATED APPLICATIONS

This application is a Continuation-in-Part of International Application No. PCT/JP2015/078032 filed on Oct. 2, 2015, which designates the United States and the entire contents of which are incorporated herein by reference.

TECHNICAL FIELD

The present invention relates to a mounting structure for mounting a shunt resistor and a method of manufacturing the mounting structure for mounting a shunt resistor.

BACKGROUND ART

A shunt resistor has been originally used as an instrument for enlarging an indication range of an ammeter by being connected parallel to the ammeter as a shunt. Recently, a shunt resistor has been popularly used not only in an electrical measurement field in the form of application to a detection of an electric current, a detection of a voltage and the like but also in a power module field in the form of application to a stabilizing circuit and the like. Although the application field of the shunt resistor has spread to fields other than the electrical measurement, a resistance value to be detected from a shunt resistor or from a mounting structure for mounting a shunt resistor has been still required to have higher accuracy than an ordinary resistance device as a function which a usual shunt resistor bears.

As the structure of a shunt resistor, there has been known a shunt resistor 730 formed by blanking an electrically conductive plate made of a Cu—Mn alloy and by bending the blanked plate into a bridge shape as shown in FIG. 14, for example. That is, the shunt resistor 730 is formed of: a bridge portion 732; a first connecting portion 734; and a second connecting portion 736 (see patent literature 1, for example).

In manufacturing a printed circuit board on which such a shunt resistor is mounted, a so-called glass epoxy substrate can be used. For example, in manufacturing a power module, a shunt resistor and other various electronic devices are mounted on a glass epoxy substrate to which a resist is applied by coating and, thereafter, the glass epoxy substrate, the shunt resistor and the various electronic devices are sealed by a resin by transfer molding so that a power module is completed.

However, there may be a case where adhesiveness between the resist applied to the glass epoxy substrate by coating and the transfer mold resin is not so high thus giving rise to a possibility that a gap is formed between the resist and the transfer mold resin. Further, there is also the following possibility. That is, when the power module is installed in an operation environment and is operated with a large electric current, due to rise and fall of a temperature of the operation environment, the generation of heat in the various electronic devices or the like, the expansion/shrinkage of the printed circuit board including the resist and the transfer mold resin repeatedly occurs. Due to a stress generated by such expansion/shrinkage, a strain is concentrated between the printed circuit board including the resist and the transfer mold resin so that a gap is formed between the resist and the transfer mold resin. When such a gap is formed, it is estimated that a gas is generated from an organic substance which the glass epoxy substrate contains or moisture or the like intrudes into the power module from the outside. These phenomenon are not desirable for the power module.

In view of the above, recently, there has been also proposed a technique where a so-called DCB substrate (Direct Copper Bonding substrate) is introduced as a printed circuit board used in a power module. The DCB substrate is a printed circuit board known as a substrate having a high dielectric voltage thus capable of allowing a large electric current to flow. For example, as shown in FIG. 15, the DCB substrate is a printed circuit board formed by directly bonding a copper pattern 850 to a ceramic substrate 807 and containing no organic substance. Adhesiveness between a ceramic substrate and a copper pattern which form such a DCB substrate and a transfer mold resin is set higher than adhesiveness between a glass epoxy substrate and a transfer mold resin. Accordingly, with the use of the DCB substrate, drawbacks which occur when the above-mentioned glass epoxy substrate is used can be obviated and hence, the generation of a gas, the intrusion of moisture and the like can be suppressed.

As shown in FIG. 16, a conventional mounting structure 900 for mounting a shunt resistor includes: a printed circuit board 905 where a first conductive pattern 910 and a second conductive pattern 920 are formed on at least one surface of a substrate 907 in a spaced-apart manner from each other; and a shunt resistor 930 mounted on one surface of the printed circuit board 905 with a bonding material 940 made of a conductive material interposed therebetween, wherein the shunt resistor 930 includes: a bridging portion 932 spaced apart from the substrate 907; a first connecting portion 934 continuously formed with one end of the bridging portion 932 and electrically connected with the first conductive pattern 910 with the bonding material 940 interposed therebetween, and a second connecting portion 936 continuously formed with the other end of the bridging portion 932 and electrically connected with the second conductive pattern 920 with the bonding material 940 interposed therebetween, assuming an axis parallel to a predetermined direction extending from one end to the other end of the bridging portion 932 as an x axis, a plane parallel to one surface of the substrate 907 as an xy plane, and an axis perpendicular to the x axis as a y axis, an axis parallel to a direction extending to one surface of the substrate 907 from the other surface of the substrate 907 as a z axis, as viewed in a plan view of the xy plane, the first conductive pattern 910 includes: a first lead-out portion 913 led out in a +x direction; and a first pull-out portion 915 pulled out to the outside of a region of the bridging portion 932 from a distal end portion of the first lead-out portion 913, and the second conductive pattern 920 includes: a second lead-out portion 923 led out in a −x direction and spaced apart from the first lead-out portion 913; and a second pull-out portion 925 pulled out to the outside of the region of the bridging portion 932 from a distal end portion of the second lead-out portion 923, and a resistance value of the shunt resistor 930 is detected between the first pull-out portion 915 and the second pull-out portion 925. In such a conventional mounting structure 900 for mounting a shunt resistor, a fillet 940*a* of the bonding material 940 such as a solder is formed in the first lead-out portion 913 and the second lead-out portion 923.

In detecting a resistance value of a shunt resistor, it is optimal to take a path along which a conductive pattern is pulled out to the outside in a y axis direction from the inside of the shunt resistor (a region just below a bridging portion) in a region with which the shunt resistor overlaps from a view point of responsiveness in detection of a resistance value, and easy arrangement of path lengths of the first pull-out portion and the second pull-out portion.

Accordingly, in the conventional mounting structure 900 for mounting a shunt resistor, the first conductive pattern 910 includes: the first lead-out portion 913 led out in a +x direction; and the first pull-out portion 915 pulled out to the outside of a region of the bridging portion 932 from the distal end portion of the led-out first lead-out portion 913, and the second conductive pattern 920 includes: the second lead-out portion 923 led out in a −x direction and spaced apart from the first lead-out portion 913; and the second pull-out portion 925 pulled out to the outside of the region of the bridging portion 932 from the distal end of portion the led-out second lead-out portion 923. Accordingly, the conductive pattern can be pulled out to the outside from the inside of the shunt resistor (the region just below the bridging portion) which is optimal for detection of a resistance value and hence, a resistance value of the shunt resistor can be detected with higher accuracy. In addition to such detection of a resistance value of the shunt resistor, according to the conventional mounting structure 900 for mounting a shunt resistor, a fillet of the bonding material 940 such as a solder spreads and hence, the shunt resistor 930 and the conductive patterns 910, 920 can be firmly joined (bonded) and fixed to each other.

CITATION LIST

Patent Literature

PTL 1: JP-A-2014-78538

SUMMARY OF INVENTION

Technical Problem

However, a bonding material such as a solder has high affinity with a conductive pattern and hence, when a lead-out portion is provided to the conductive pattern, the bonding material is likely to spread to the lead-out portion by wetting. Accordingly, when a bonding condition (amount of a bonding material such as a solder, a temperature, a pressing force, a position of a shunt resistor or the like) changes, a degree of spreading of a fillet of the bonding material becomes irregular or an area of contact between the bonding material and a lower surface of a bridging portion due to crawling becomes irregular. Accordingly, even when a resistance value of the shunt resistor per se is a normal value, depending on a mounting state of the shunt resistor, there arises a drawback that a resistance value detected between the first pull-out portion and the second pull-out portion becomes irregular.

The present invention has been made to overcome the above-mentioned drawbacks, and it is an object of the present invention to provide a mounting structure for mounting a shunt resistor and a method of manufacturing a mounting structure for mounting a shunt resistor which can achieve both the firm joining (bonding) and fixing of a shunt resistor and a conductive pattern to each other by spreading of a fillet of the bonding material and the suppression of irregularities in a resistance value detected between a first pull-out portion and a second pull-out portion by suppressing irregularities in an area of the fillet of the bonding material by controlling a degree of spreading of the fillet of the bonding material to a lead-out portion.

Solution to Problem

[1] A first mounting structure for mounting a shunt resistor according to the present invention is directed to a mounting structure for mounting a shunt resistor which includes: a printed circuit board where a first conductive pattern and a second conductive pattern are formed on at least one surface of a substrate in a spaced-apart manner from each other; and a shunt resistor mounted on one surface of the printed circuit board with a bonding material made of a conductive material interposed therebetween, wherein the shunt resistor includes: a bridging portion spaced apart from the substrate; a first connecting portion continuously formed with one end of the bridging portion and electrically connected with the first conductive pattern with the bonding material interposed therebetween, and a second connecting portion continuously formed with the other end of the bridging portion and electrically connected with the second conductive pattern with the bonding material interposed therebetween, assuming an axis parallel to a predetermined direction extending from one end to the other end of the bridging portion as an x axis, a plane parallel to one surface of the substrate as an xy plane, and an axis perpendicular to the x axis as a y axis, an axis parallel to a direction extending to one surface of the substrate from the other surface of the substrate as a z axis, as viewed in a plan view of the xy plane, the first conductive pattern includes: a first lead-out portion led out in a +x direction; and a first pull-out portion pulled out to the outside of a region of the bridging portion from a distal end portion of the first lead-out portion, and the second conductive pattern includes: a second lead-out portion led out in a −x direction and spaced apart from the first lead-out portion; and a second pull-out portion pulled out to the outside of the region of the bridging portion from a distal end portion of the led-out second lead-out portion, and a resistance value of the shunt resistor is detected between the first pull-out portion and the second pull-out portion, wherein a bonding material flow-out preventing resist is disposed on a portion of a surface of at least one of the first lead-out portion and the second lead-out portion, and a fillet of the bonding material terminates at a position corresponding to a position where the bonding material flow-out preventing resist is disposed as viewed in cross section taken along an xz plane. In this specification, "made of" includes "essentially made of".

[2] In the first mounting structure for mounting a shunt resistor according to the present invention, it is preferable that the bonding material flow-out preventing resist be formed in a pattern formed in an elongated strip shape in a y axis direction as viewed in a plan view of the xy plane.

[3] In the first mounting structure for mounting a shunt resistor according to the present invention, it is preferable that the bonding material flow-out preventing resist have an L-shaped pattern as viewed in a plan view of the xy plane, and the bonding material flow-out preventing resist be disposed such that a crest of a bent portion of the L-shaped pattern is brought into contact with the bonding material.

[4] In the first mounting structure for mounting a shunt resistor according to the present invention, it is preferable that the bonding material flow-out preventing resist have a home-base-shape pattern as viewed in a plan view of the xy plane, and the bonding material flow-out preventing resist be disposed such that an acute-angled crest of the home-base pattern is brought into contact with the bonding material.

[5] In the first mounting structure for mounting a shunt resistor according to the present invention, it is preferable that the bonding material flow-out preventing resist have an elliptical or circular pattern in a plan view of the xy plane.

[6] In the first mounting structure for mounting a shunt resistor according to the present invention, it is preferable that a portion of the bonding material flow-out preventing resist be brought into contact with a lower surface of the first connecting portion or a lower surface of the second connecting portion of the shunt resistor in an overlapping manner.

[7] A second mounting structure for mounting a shunt resistor according to the present invention is directed to a mounting structure for mounting a shunt resistor which includes: a printed circuit board where a first conductive pattern and a second conductive pattern are formed on at least one surface of a substrate in a spaced-apart manner from each other; and
a shunt resistor mounted on one surface of the printed circuit board with a bonding material made of a conductive material interposed therebetween, wherein the shunt resistor includes: a bridging portion spaced apart from the substrate; a first connecting portion continuously formed with one end of the bridging portion and electrically connected with the first conductive pattern with the bonding material interposed therebetween, and a second connecting portion continuously formed with the other end of the bridging portion and electrically connected with the second conductive pattern with the bonding material interposed therebetween, assuming an axis parallel to a predetermined direction extending from one end to the other end of the bridging portion as an x axis, a plane parallel to one surface of the substrate as an xy plane, and an axis perpendicular to the x axis as a y axis, an axis parallel to a direction extending to one surface of the substrate from the other surface of the substrate as a z axis, as viewed in a plan view of the xy plane, the first conductive pattern includes: a first lead-out portion led out in a +x direction; and a first pull-out portion pulled out to the outside of a region of the bridging portion from a distal end portion of the first lead-out portion, and the second conductive pattern includes: a second lead-out portion led out in a −x direction and spaced apart from the first lead-out portion; and a second pull-out portion pulled out to the outside of the region of the bridging portion from a distal end portion of the second lead-out portion, and a resistance value of the shunt resistor is detected between the first pull-out portion and the second pull-out portion, wherein as viewed in a cross section taken along an xz plane, at least one of the first lead-out portion and the second lead-out portion has a portion where a thickness in a z axis direction changes from a first thickness to a second thickness smaller than the first thickness, and a fillet of the bonding material terminates at a position corresponding to a position of the portion where the first lead-out portion or/and the second lead-out portion has/have the second thickness.

[8] A third mounting structure for mounting a shunt resistor according to the present invention is directed to a mounting structure for mounting a shunt resistor which includes: a printed circuit board where a first conductive pattern and a second conductive pattern are formed on at least one surface of a substrate in a spaced-apart manner from each other; and
a shunt resistor mounted on one surface of the printed circuit board with a bonding material made of a conductive material interposed therebetween, wherein the shunt resistor includes: a bridging portion spaced apart from the substrate; a first connecting portion continuously formed with one end of the bridging portion and electrically connected with the first conductive pattern with the bonding material interposed therebetween, and a second connecting portion continuously formed with the other end of the bridging portion and electrically connected with the second conductive pattern with the bonding material interposed therebetween,
assuming an axis parallel to a predetermined direction extending from one end to the other end of the bridging portion as an x axis, a plane parallel to one surface of the substrate as an xy plane, and an axis perpendicular to the x axis as a y axis, an axis parallel to a direction extending to one surface of the substrate from the other surface of the substrate as a z axis, as viewed in a plan view of the xy plane, the first conductive pattern includes: a first lead-out portion led out in a +x direction; and a first pull-out portion pulled out to the outside of a region of the bridging portion from a distal end portion of the first lead-out portion, and the second conductive pattern includes: a second lead-out portion led out in a −x direction and spaced apart from the first lead-out portion; and a second pull-out portion pulled out to the outside of the region of the bridging portion from a distal end portion of the second lead-out portion, and
a resistance value of the shunt resistor is detected between the first pull-out portion and the second pull-out portion, wherein
as viewed in a plan view of the xy plane, at least one of the first lead-out portion and the second lead-out portion has a portion where a width in a y axis direction changes from a first width to a second width narrower than the first width, and a fillet of the bonding material terminates at a position corresponding to a position of a portion where the first lead-out portion or/and the second lead-out portion has/have the second width as viewed in a cross section taken along an xz plane.

[9] In the mounting structure for mounting a shunt resistor according to the present invention, it is preferable that as viewed in a plan view of the xy plane, the bonding material flow-out preventing resist be further provided outside a region which the shunt resistor occupies in the first conductive pattern or/and the second conductive pattern.

[10] In the mounting structure for mounting a shunt resistor according to the present invention, it is preferable that as viewed in a plan view of the xy plane, the bonding material flow-out preventing resist be further provided outside a region which the shunt resistor occupies in the first conductive pattern or/and the second conductive pattern, and
the bonding material flow-out preventing resist disposed inside the region which the shunt resistor occupies and the bonding material flow-out preventing resist disposed outside the region which the shunt resistor occupies be continuously formed with each other.

[11] In the mounting structure for mounting a shunt resistor according to the present invention, it is preferable that the first connecting portion of the shunt resistor be continuously formed with one end of the bridging portion, and be formed in an extending manner in a direction (−x direction) which is directed toward one end side from the other end side of the bridging portion, and the second connecting portion of the shunt resistor be continuously formed with the other end of the bridging portion, and be formed in an extending manner in a direction (+x direction) which is directed toward the other end side from one end side of the bridging portion.

[12] In the mounting structure for mounting a shunt resistor according to the present invention, it is preferable that the first connecting portion of the shunt resistor be continuously formed with one end of the bridging portion, and be formed in an extending manner in a direction (+x direction) which is directed toward the other end side from one end side of the bridging portion, and the second connecting portion of the shunt resistor be continuously formed with the other end of the bridging portion, and be formed in an extending manner in a direction (−x direction) which is directed toward one end side from the other end side of the bridging portion.

[13] A method of manufacturing a mounting structure for mounting a shunt resistor according to the present invention is directed to a method of manufacturing a mounting structure for mounting a shunt resistor, the method provided for manufacturing a mounting structure for mounting a shunt resistor where the mounting structure includes: a printed circuit board where a first conductive pattern and a second conductive pattern are formed on at least one surface of a substrate in a spaced-apart manner from each other; and a shunt resistor which includes a bridging portion spaced apart from the substrate, a first connecting portion continuously formed with one end of the bridging portion, and a second connecting portion continuously formed with the other end of the bridging portion, the first connecting portion is electrically connected with the first conductive pattern with a bonding material made of a conductive material interposed therebetween, the second connecting portion is electrically connected with the second conductive pattern with the bonding material interposed therebetween, and a resistance value of the shunt resistor is detected between a first pull-out portion which the first conductive pattern has and a second pull-out portion which the second conductive pattern has, the method including: a preparatory mounting step which includes: a printed circuit board preparation step of preparing a printed circuit board where, assuming an axis parallel to a predetermined direction extending from one end to the other end of the bridging portion as an x axis, a plane parallel to one surface of the substrate as an xy plane, and an axis perpendicular to the x axis as a y axis, an axis parallel to a direction extending to one surface of the substrate from the other surface of the substrate as a z axis, as viewed in a plan view of the xy plane, the first conductive pattern includes: a first lead-out portion led out in a +x direction; and a first pull-out portion pulled out to the outside of a region of the bridging portion from a distal end portion of the first lead-out portion, and the second conductive pattern includes: a second lead-out portion led out in a −x direction and spaced apart from the first lead-out portion; and a second pull-out portion pulled out to the outside of the region of the bridging portion from a distal end portion of the second lead-out portion; a bonding material flow-out preventing resist applying step of applying a bonding material flow-out preventing resist to a portion of the surface of at least one of the first lead-out portion and the second lead-out portion of the printed circuit board; and a shunt resistor preparation step of preparing the shunt resistor; a bonding material applying step of applying a bonding material made of a conductive material to surfaces of the first lead-out portion and the second lead-out portion of the printed circuit board at least at positions where the first lead-out portion and the second lead-out portion are respectively made to overlap with the first connecting portion and the second connecting portion of the shunt resistor; a shunt resistor alignment step of aligning the shunt resistor by making the shunt resistor relatively move with respect to the printed circuit board in a plan view of the xy plane thus making a second land on the second conductive pattern to which the second connecting portion is to be connected and the second connecting portion of the shunt resistor overlap with each other while making a first land on the first conductive pattern to which the first connecting portion is to be connected and the first connecting portion of the shunt resistor overlap with each other; and a bonding step of performing bonding by the bonding material where the bonding material is melted by heating at least the first connecting portion and the second connecting portion of the shunt resistor, and the first land, the second land, the first lead-out portion and the second lead-out portion of the printed circuit board thus terminating the flow of a fillet of the bonding material at a position corresponding to a position where the bonding material flow-out preventing resist is formed as viewed in a cross section taken along an xz plane.

Advantageous Effects of Invention

The first mounting structure for mounting a shunt resistor according to the present invention adopts the configuration where the bonding material flow-out preventing resist is disposed on the surfaces of the first lead-out portion and the second lead-out portion, and the fillet of the bonding material terminates at the position corresponding to the position where the bonding material flow-out preventing resist is formed. With such a configuration, the first mounting structure for mounting a shunt resistor according to the present invention can achieve both the firm joining (bonding) and fixing of a shunt resistor and a conductive pattern to each other by spreading of the fillet of the bonding material and the suppression of irregularities in a resistance value detected between the first pull-out portion and the second pull-out portion by suppressing irregularities in an area of the fillet of the bonding material by controlling a degree of spreading of the fillet of the bonding material to the first lead-out portion and the second lead-out portion.

The second mounting structure for mounting a shunt resistor according to the present invention adopts the configuration where the first lead-out portion and the second lead-out portion respectively have a portion where a thickness changes from a first thickness to a second thickness which is smaller than the first thickness, and the fillet of the bonding material terminates at the respective positions corresponding to positions of portions where the first lead-out portion and the second lead-out portion have the second thickness. With such a configuration, the second mounting structure for mounting a shunt resistor according to the present invention can achieve both the firm joining (bonding) and fixing of the shunt resistor and the conductive pattern to each other by spreading of the fillet of the bonding material and the suppression of irregularities in a resistance value detected between the first pull-out portion and the second pull-out portion by suppressing irregularities in an area of the fillet of the bonding material by controlling a degree of spreading of the fillet of the bonding material to the first lead-out portion and the second lead-out portion.

The third mounting structure for mounting a shunt resistor according to the present invention adopts the configuration where the first lead-out portion and the second lead-out portion respectively have a portion where a width changes from a first width to a second width which is narrower than the first width, and the fillet of the bonding material terminates at the respective positions corresponding to positions of portions where the first lead-out portion and the second lead-out portion have the second width. With such a configuration, the third mounting structure for mounting a shunt resistor according to the present invention can achieve both the firm joining (bonding) and fixing of the shunt resistor and the conductive pattern to each other by spreading of the fillet of the bonding material and the suppression of irregularities in a resistance value detected between the first pull-out portion and the second pull-out portion by suppressing irregularities in an area of the fillet of the bonding material by controlling a degree of spreading of the fillet of the bonding material to the first lead-out portion and the second lead-out portion.

A method of manufacturing a mounting structure for mounting a shunt resistor according to the present invention includes: the bonding material flow-out preventing resist applying step of applying the bonding material flow-out preventing resist to the first lead-out portion and the second lead-out portion by coating; and the bonding step of melting the bonding material and terminating the flow of the fillet of the bonding material respectively at positions corresponding to positions where the bonding material flow-out preventing resist is formed. With such steps, it is able to control a degree of spreading of the fillet of the bonding material to the first lead-out portion and the second lead-out portion. Accordingly, the manufactured mounting structure for mounting a shunt resistor can achieve both the firm joining (bonding) and fixing of the shunt resistor and the conductive pattern to each other of spreading of the fillet of the bonding material and the suppression of irregularities in a resistance value detected between the first pull-out portion and the second pull-out portion by suppressing irregularities in an area of the fillet of the bonding material by controlling a degree of spreading of the fillet of the bonding material to the first lead-out portion and the second lead-out portion.

BRIEF DESCRIPTION OF DRAWINGS

FIG. 1A is a plan view of the mounting structure 100 for mounting a shunt resistor as viewed on an xy plane, and FIG. 1B is a cross-sectional view taken along a line A-A' in FIG. 1A.

FIG. 3A to FIG. 3C are views for describing a preparatory mounting step S10, wherein FIG. 3A shows a printed circuit board preparation step, FIG. 3B shows a bonding material flow-out preventing resist applying step, and FIG. 3C shows a shunt resistor preparation step. FIG. 3D shows a bonding material applying step S20, FIG. 3E shows a shunt resistor alignment step S30, and FIG. 3F shows a bonding step S40.

FIG. 4A and FIG. 4B are views for describing a mounting structure 200 for mounting a shunt resistor according to an embodiment 2, wherein FIG. 4A is a plan view of the mounting structure 200 for mounting a shunt resistor as viewed on an xy plane and FIG. 4B is a cross-sectional view taken along a line A-A' in FIG. 4A.

FIG. 5A and FIG. 5B are views for describing a mounting structure 300 for mounting a shunt resistor according to an embodiment 3, wherein FIG. 5A is a plan view of the mounting structure 300 for mounting a shunt resistor as viewed on an xy plane and FIG. 5B is a cross-sectional view taken along a line A-A' in FIG. 5A.

FIG. 6A and FIG. 6B are views for describing a mounting structure 400 for mounting a shunt resistor according to an embodiment 4, wherein FIG. 6A is a plan view of the mounting structure 400 for mounting a shunt resistor as viewed on an xy plane and FIG. 6B is a cross-sectional view taken along a line A-A' in FIG. 6A.

FIG. 7A and FIG. 7B are views for describing a mounting structure 500 for mounting a shunt resistor according to an embodiment 5, wherein FIG. 7A is a plan view of the mounting structure 500 for mounting a shunt resistor as viewed on an xy plane and FIG. 7B is a cross-sectional view taken along a line A-A' in FIG. 7A.

FIG. 9A is a plan view of the mounting structure 100a for mounting a shunt resistor as viewed on an xy plane and FIG. 9B is a cross-sectional view taken along a line A-A' in FIG. 9A. FIG. 9C is an enlarged view of a portion surrounded by a dotted line in FIG. 9A.

FIG. 10 A to FIG. 10C are views for describing a mounting structure 100b for mounting a shunt resistor according to a modification 2.

FIG. 11A is a plan view of the mounting structure 100c for mounting a shunt resistor as viewed on an xy plane and FIG. 11B is a cross-sectional view taken along a line A-A' in FIG. 11A. FIG. 11C is an enlarged view of a portion surrounded by a dotted line in FIG. 11A.

FIG. 12A is a plan view of the mounting structure 100d for mounting a shunt resistor as viewed on an xy plane and FIG. 12B is a cross-sectional view taken along a line A-A' in FIG. 12A. FIG. 12C is an enlarged view of a portion surrounded by a dotted line in FIG. 12A.

FIG. 13A is a plan view of the mounting structure 100e for mounting a shunt resistor as viewed on an xy plane and FIG. 13B is a cross-sectional view taken along a line A-A' in FIG. 13A.

FIG. 15A is a plan view of the DCB substrate 805, and FIG. 15B is a cross-sectional view taken along a line B-B' in FIG. 15A.

FIG. 16A is a plan view of the mounting structure 900 for mounting the shunt resistor and FIG. 16B is a cross-sectional view taken along a line A-A' in FIG. 16A.

DESCRIPTION OF EMBODIMENTS

Figure 1A:
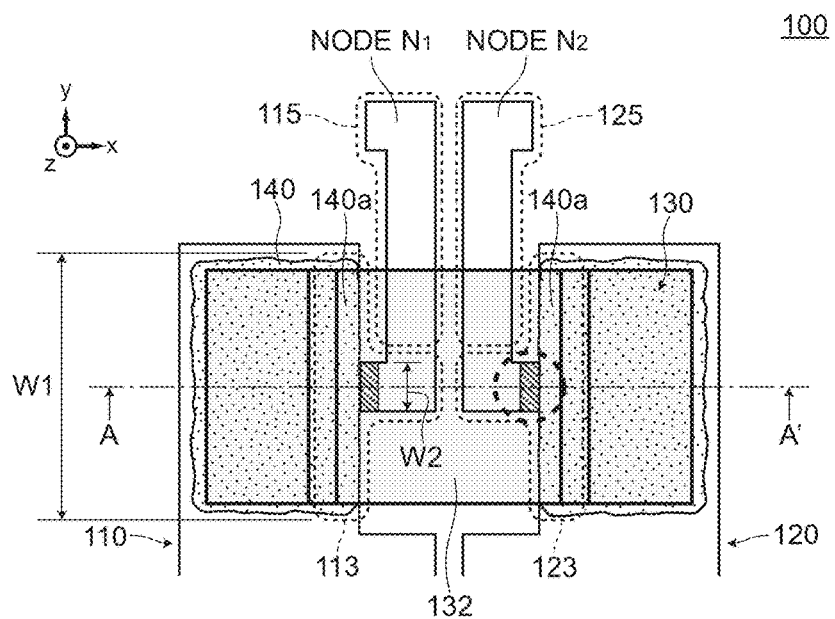
FIG. 1A and FIG. 1B are views for describing a mounting structure 100 for mounting a shunt resistor according to an embodiment 1.

Hereinafter, a mounting structure for mounting a shunt resistor and a method of mounting a shunt resistor according to the present invention are described based on embodiments shown in the drawings.

Drawings which show a shunt resistor, a printed circuit board, a mounting structure for mounting a shunt resistor and the like are all schematic views and hence, the indication of sizes and angles does not always conform to actual sizes and angles.

[Embodiment 1]

1. Mounting Structure 100 for Mounting a Shunt Resistor

As shown in FIG. 1, a mounting structure 100 for mounting a shunt resistor according to an embodiment 1 includes: a printed circuit board 105 where a first conductive pattern 110 and a second conductive pattern 120 are formed on at least one surface of a substrate 107 in a spaced-apart manner from each other; and a shunt resistor 130 mounted on one surface of the printed circuit board 105 with a bonding material 140 made of a conductive material interposed therebetween.

(1) Shunt Resistor 130

As the shunt resistor 130, for example, a member which is obtained by blanking and bending a conductive plate can be used. The conductive plate may be made of a Cu—Mn alloy, a Cu—Mn—Ni alloy or the like provided that the conductive plate functions as a resistance element.

The shunt resistor 130 has a bridge-shaped structure. That is, the shunt resistor 130 includes: a bridging portion 132 spaced apart from the substrate 107; a first connecting portion 134 continuously formed with one end of the bridging portion 132 and with which the first conductive pattern 110 is to be electrically connected with the bonding material 140 interposed therebetween, and a second connecting portion 136 continuously formed with the other end of the bridging portion 132 and with which the second conductive pattern 120 is to be electrically connected with the bonding material 140 interposed therebetween (see FIG. 1).

In this embodiment, a plane formed by an x axis and a y axis perpendicular to the x axis is defined as an xy plane, and an axis orthogonal to the xy plane is defined as a z axis. In the embodiment 1, the x axis is formed of an axis extending parallel to a predetermined direction directed to the other end from one end of the bridging portion 132, the xy plane is formed of a plane parallel to one surface of the substrate, the y axis is formed of an axis perpendicular to the x axis, and the z axis is formed of an axis extending parallel to a direction directed to one surface from the other surface of the substrate 107 (see the indications of axes described in FIG. 1 or the like).

For example, in the embodiment 1, a shunt resistor may be used where the first connecting portion 134 and the second connecting portion 136 are disposed such that the first connecting portion 134 and the second connecting portion 136 extend toward the outside. In the shunt resistor 130 where the first connecting portion 134 and the second connecting portion 136 extend toward the outside, the first connecting portion 134 is continuously formed on one end of the bridging portion 132, and is formed such that the first connecting portion 134 is formed in an extending manner toward a direction directed to one end side (−x direction) from the other end side of the bridging portion 132, while the second connecting portion 136 is continuously formed on the other end of the bridging portion 132, and is formed such that the second connecting portion 136 is formed in an extending manner toward a direction directed to the other end side (+x direction) from one end side of the bridging portion 132 (see FIG. 1A and FIG. 1B).

(2) Printed Circuit Board 105

As the printed circuit board 105, for example, a DCB substrate can be used. When the DCB substrate is the printed circuit board 105, the substrate 107 is formed of a ceramic substrate, and the first conductive pattern 110 and the second conductive pattern 120 are made of copper. In the embodiment 1, the conductive pattern is formed on only one surface (upper surface) of the substrate 107. However, the conductive pattern may be formed on the other surface (lower surface).

The substrate 107 has insulating property to an extent that the electrical insulation can be acquired between the conductive patterns formed at least on the same plane and, at the same time, the electrical insulation can be acquired between the conductive pattern on one surface and the conductive pattern on the other surface. As a material for forming the substrate 107, it is preferable that the substrate 107 be made of an inorganic material which contains no organic substances.

Further, the first conductive pattern 110 and the second conductive pattern 120 may be formed of any material provided that the material is a conductive material.

In the printed circuit board 105, the first conductive pattern 110 and the second conductive pattern 120 are formed on at least one surface of a substrate 107 in a spaced-apart manner from each other.

The first conductive pattern 110 has a first land to which the first connecting portion 134 of the shunt resistor 130 is to be connected. The first conductive pattern 110 includes: a first lead-out portion 113 led out in a +x direction from the first land; and a first pull-out portion 115 pulled out to the outside of a region of the bridging portion 132 from a distal end portion of the first lead-out portion 113 as viewed in a plan view of an xy plane.

As shown in FIG. 1A, the first lead-out portion 113 has a portion where a width in a y axis direction becomes a first width W1 corresponding to a width of the first connecting portion 134, and further extends from such a portion in a +x direction and the portion has a second width W2 narrower than the first width W1.

In this embodiment, it is assumed that "region of the bridging portion 132" virtually means a region which the bridging portion 132 of the shunt resistor 130 occupies as viewed in a plan view of the xy plane (understood substantially in the same manner with respect to "the region just below the bridging portion 132).

Further, the second conductive pattern 120 has a second land to which the second connecting portion 136 of the shunt resistor 130 is to be connected.

The second conductive pattern 120 includes: a second lead-out portion 123 led out in a −x direction from the second land and spaced apart from the first lead-out portion 113; and a second pull-out portion 125 pulled out to the outside of the region of the bridging portion 132 from a distal end portion of the second lead-out portion 123.

As shown in FIG. 1A, the second lead-out portion 123 has a portion where a width in a y axis direction becomes a first width W1 corresponding to a width of the second connecting portion 136, and further extends from such a portion in a −x direction and the portion has a second width W2 narrower than the first width W1.

In the mounting structure 100 for mounting a shunt resistor according to the embodiment 1, a resistance value of the shunt resistor 130 can be detected between the first pull-out portion 115 and the second pull-out portion 125 (for example, by using a node N1 and a node N2 shown in FIG. 1A as detection terminals or the like).

Here, "node" forms a part of the pull-out portion and is a virtual or real point for detecting a resistance value of the shunt resistor. For example, in FIG. 1A, the node N1 is provided to a distal end portion of the first pull-out portion 115 and the node N2 is provided to a distal end portion of the second pull-out portion 125.

In the detection of a resistance value of the shunt resistor, as has been already described in "Background Art", it is optimal to adopt a path through which a conductive pattern is pulled out to the outside of the shunt resistor in a y axis direction from the inside (a region just below the bridging portion) of the shunt resistor within a region with which the shunt resistor overlaps from a view point of responsiveness in detection of a resistance value and easy arrangement of path lengths of the first pull-out portion and the second pull-out portion.

With such a configuration, according to the mounting structure 100 for mounting a shunt resistor of the embodiment 1, the mounting structure 100 includes the first lead-out portion 113, the first pull-out portion 115, the second lead-out portion 123 and the second pull-out portion 125 and hence, a conductive pattern can be pulled out to the outside from the inside (the region just below the bridging portion 132) of the shunt resistor 130 optimum for the detection of a resistance value whereby a resistance value of the shunt resistor can be detected with higher accuracy.

(3) Bonding Material Flow-Out Preventing Resist 150, Bonding Material 140 and Fillet 140a of Bonding Material 140

As the bonding material flow-out preventing resist 150, a solder resist made of a thermosetting epoxy resin or the like is used. The bonding material flow-out preventing resist 150 may be any material provided that the material can be disposed on at least a surface of the conductive pattern of the printed circuit board 105 and has low affinity with the bonding material 140 such as a solder so that the bonding material 140 is minimally adhered to the bonding material flow-out preventing resist 150. For example, the bonding material flow-out preventing resist 150 may be a resist formed by a plating method or the like besides a solder resist made of a thermosetting epoxy resin or the like.

A solder is used as the bonding material 140. The bonding material 140 may be made of any material provided that the material is a conductive material and can electrically connect at least two objects to be bonded to each other and, at the same time, can also mechanically bond these objects to each other. The bonding material 140 may be made of a material such as a silver paste, a silver nano-paste besides a solder, for example.

In the mounting structure 100 for mounting a shunt resistor according to the embodiment 1, a bonding material flow-out preventing resist 150 is disposed on portions of respective surfaces of the first lead-out portion 113 and the second lead-out portion 123.

Figure 1B:
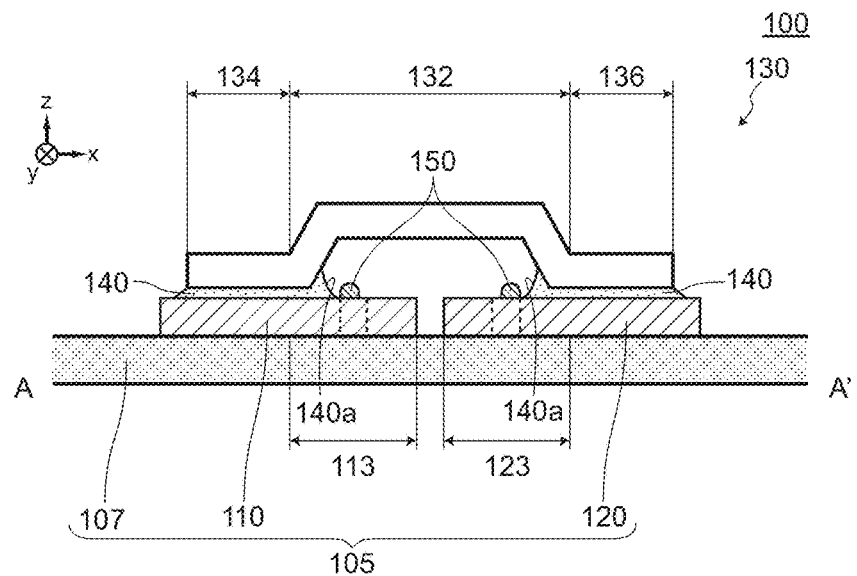

As a pattern of the bonding material flow-out preventing resist 150, as shown in FIG. 1A and FIG. 1B, it is preferable that the bonding material flow-out preventing resist 150 adopt a pattern formed in an elongated strip shape in a y axis direction as viewed in a plan view of the xy plane (see FIG. 1A).

The bonding material flow-out preventing resist 150 having a strip shape may be, as shown in FIG. 1A, disposed at a portion of the first lead-out portion 113 having a second width W2 and at a position disposed adjacently to a boundary where a width of the first lead-out portion 113 is changed over from a first width W1 to the second width W2. The bonding material flow-out preventing resist 150 having a strip shape which is disposed on the second lead-out portion 123 may have substantially the same configuration as the bonding material flow-out preventing resist 150 on the first lead-out portion 113.

A fillet 140a of the bonding material 140 terminates at a position corresponding to a position where the bonding material flow-out preventing resist 150 is disposed as viewed in cross section taken along an xz plane.

Figure 16A:
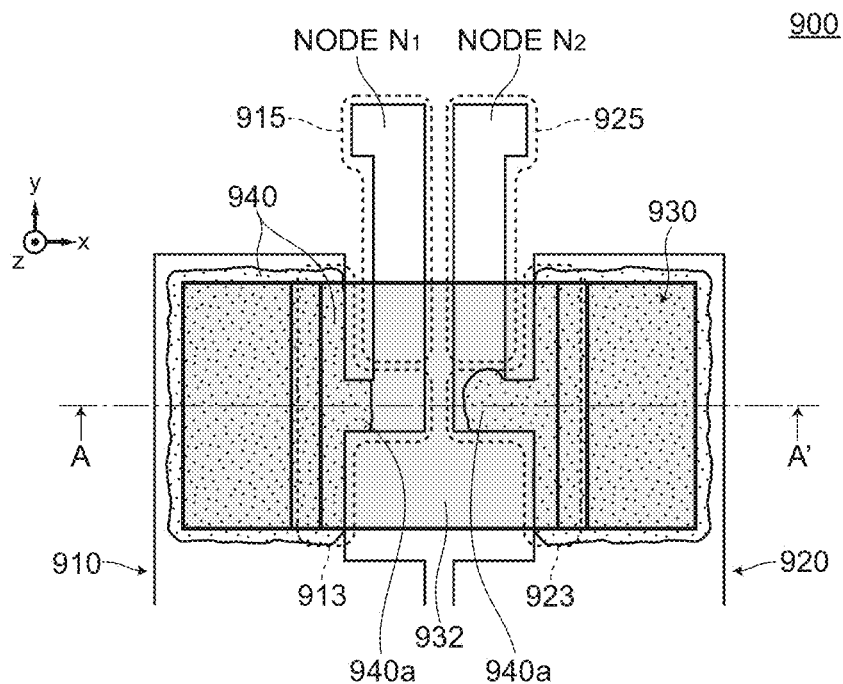
FIG. 16A and FIG. 16B are views for describing a mounting structure 900 for mounting a conventional shunt resistor.
Figure 16B:
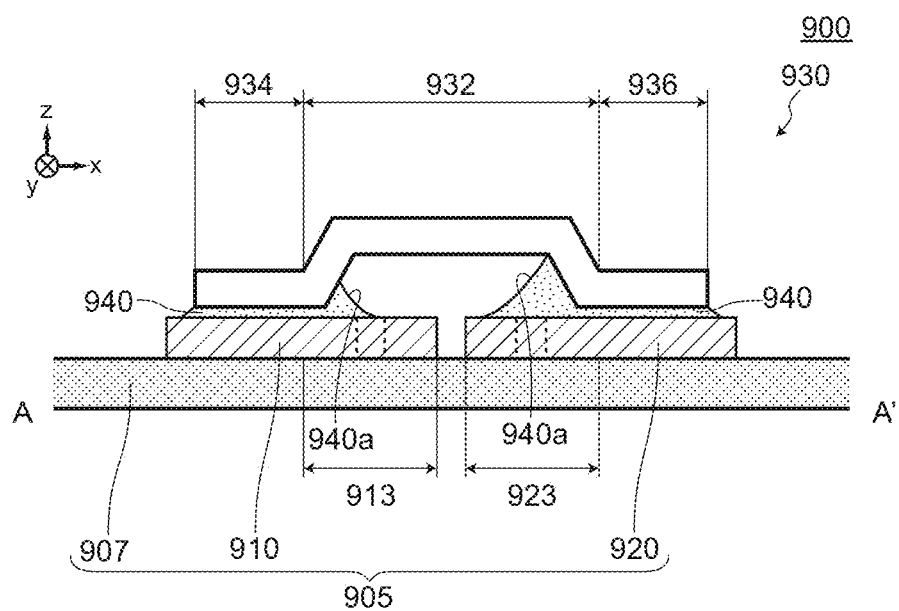

In this embodiment, "fillet 140a" is a portion having a downward flaring-out shape where the bonding material 140 such as a solder is melted and spreads by wetting on the conductive pattern (see symbol 140a in FIG. 1A and FIG. 1B, symbol 940a in FIG. 16A and FIG. 16B and the like).

The configuration "A fillet 140a of the bonding material 140 terminates at a position corresponding to a position where the bonding material flow-out preventing resist 150 is disposed as viewed in cross section taken along an xz plane" includes the configuration having a positional relationship where a fillet end portion of the fillet 140a having a thickness of substantially zero is in contact with the bonding material flow-out preventing resist 150, as shown in FIG. 1A, for example. Further, although not shown in the drawing, the fillet 140a may have the configuration with a positional relationship where a portion of the fillet 140a having a thickness slightly overlaps with the bonding material flow-out preventing resist 150 within a range where the fillet 140a does not go beyond the bonding material flow-out preventing resist 150 as viewed in a plan view of the xy plane. By controlling a degree of such overlapping, irregularities in an area of the fillet 140a can be controlled. Further, a contact area between the bonding material 140 and the first lead-out portion 113 is eventually restricted due to the bonding material flow-out preventing resist 150 and hence, the irregularities in the contact area can be also controlled within a fixed range.

2. Method of Manufacturing Mounting Structure 100 for Mounting Shunt Resistor

Next, the method of manufacturing a mounting structure for mounting a shunt resistor according to the embodiment 1 is described.

Figure 2:
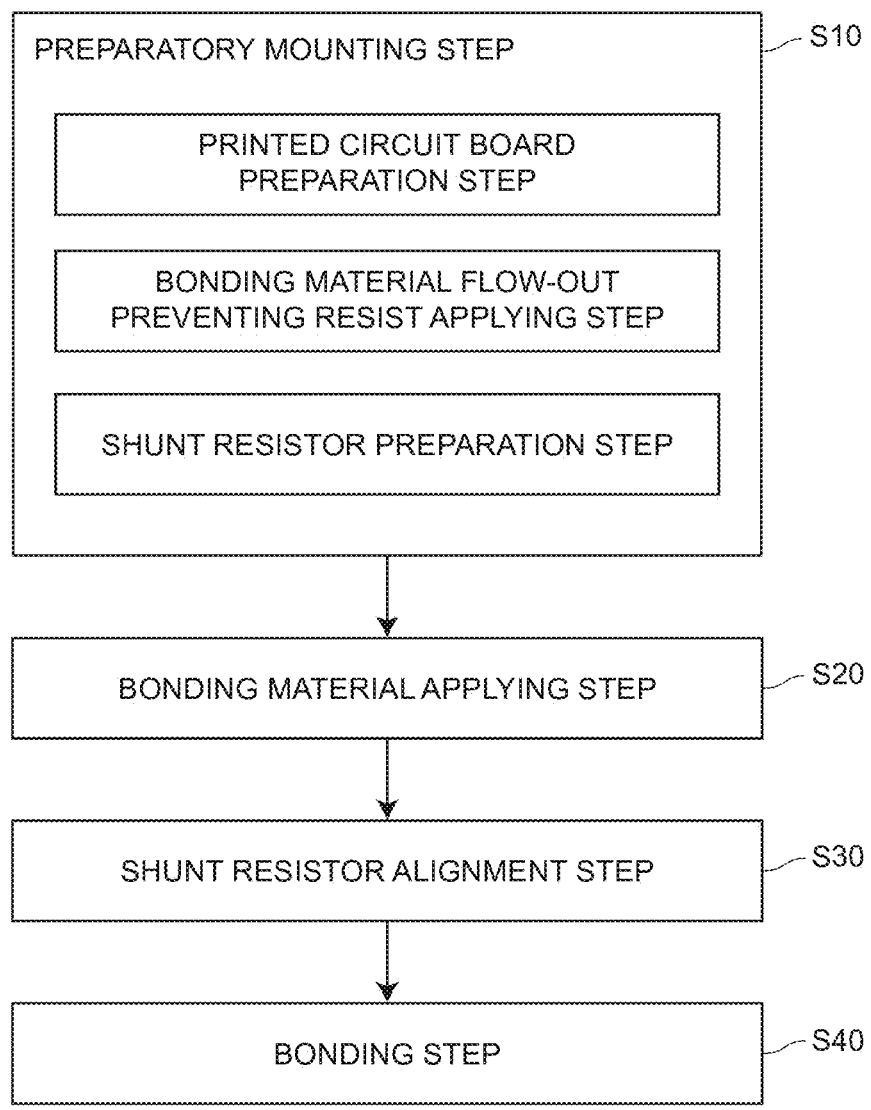
FIG. 2 is a flowchart for describing a method of manufacturing the mounting structure 100 for mounting a shunt resistor according to the embodiment 1.

As shown in FIG. 2, the method of manufacturing a mounting structure for mounting the shunt resistor according to the embodiment 1 includes: a preparatory mounting step S10; a bonding material applying step S20; a shunt resistor alignment step S30; and a bonding step S40.

Hereinafter, the method of manufacturing a mounting structure for mounting a shunt resister according to the embodiment 1 is described in detail with reference to FIG. 2 and FIG. 3A to FIG. 3F.

A method of manufacturing a mounting structure for mounting a shunt resistor according to the embodiment 1 is provided for manufacturing the mounting structure 100 for mounting a shunt resistor having the following configuration. That is, the mounting structure 100 includes: the printed circuit board 105 where the first conductive pattern 110 and the second conductive pattern 120 are formed on at least one surface of the substrate 107 in a spaced-apart manner from each other; and the shunt resistor 130 including the bridging portion 132 spaced apart from the substrate 107; the first connecting portion 134 continuously formed with one end of the bridging portion 132; and the second connecting portion 136 continuously formed with the other end of the bridging portion 132. The first connecting portion 134 is electrically connected with the first conductive pattern 110 with the bonding material 140 made of a conductive material interposed therebetween, and the second connecting portion 136 is electrically connected with the second conductive pattern 120 with the bonding material 140 interposed therebetween. A resistance value of the shunt resistor 130 is detected between the first pull-out portion 115 which the first conductive pattern 110 has and the second pull-out portion 125 which the second conductive pattern 120 has.

(1) The preparatory mounting step S10 includes a printed circuit board preparation step, a bonding material flow-out preventing resist applying step and a shunt resistor preparation step.

Figure 3A:
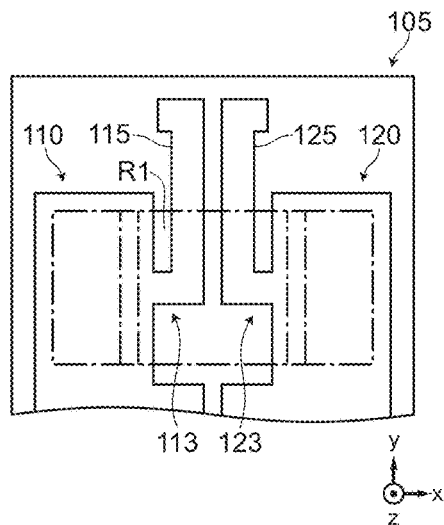
FIG. 3A to FIG. 3F are views for describing the method of manufacturing the mounting structure 100 for mounting a shunt resistor according to the embodiment 1.

(i) The printed circuit board preparation step is a step for preparing a printed circuit board where the first conductive pattern 110 includes: the first lead-out portion 113 led out in a +x direction; and the first pull-out portion 115 pulled out to the outside of a region of the bridging portion 132 from the distal end portion of the first lead-out portion 113, and the second conductive pattern 120 includes: the second lead-out portion 123 led out in a −x direction and spaced apart from the first lead-out portion 113; and the second pull-out portion 125 pulled out to the outside of the region of the bridging portion 132 from the distal end portion of the second lead-out portion 123 (see FIG. 3A).

Figure 3B:
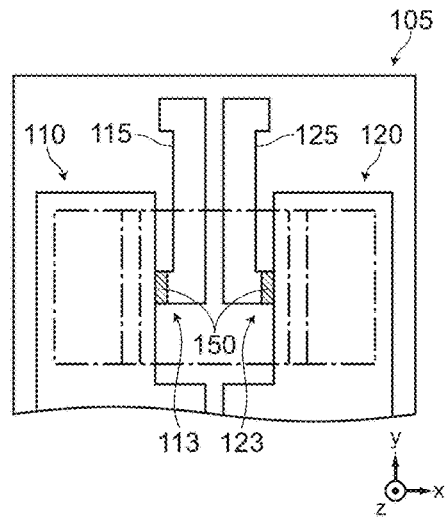

(ii) The bonding material flow-out preventing resist applying step is a step of applying by coating the bonding material flow-out preventing resist 150 to a portion of the surface of the first lead-out portion 113 and a portion of the surface of the second lead-out portion 123 in the printed circuit board 105 (see FIG. 3B).

In this embodiment, "applying by coating" means all forms of applying by coating including adhesion or fixing of a resist material to the printed circuit board 105. For example, the bonding material flow-out preventing resist 150 may be applied by coating using a squeegee printing method or may be applied by coating by spraying a resist material using a fine head. A resist material may be formed on the printed circuit board 105 by a plating method.

Figure 3C:
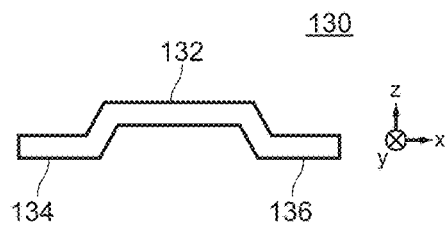

(iii) The shunt resistor preparation step is a step of preparing the above-mentioned shunt resistor 130 (see FIG. 3C).

In this embodiment, (i) printed circuit board preparation step, (ii) the bonding material flow-out preventing resist applying step, and (iii) shunt resistor preparation step have been described in this order. However, in actual design of the steps, the order of steps may be changed such that the steps are performed in the order of (i), (iii), and (ii).

Figure 3D:
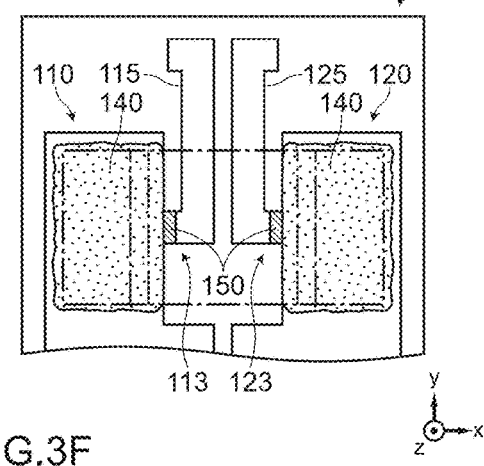

(2) The bonding material applying step S20 is a step of applying a bonding material 140 made of a conductive material to surfaces of the first lead-out portion 113 and the second lead-out portion 123 of the printed circuit board 105 at least positions where the first lead-out portion 113 and the second lead-out portion 123 are respectively made to overlap with the first connecting portion 134 and the second connecting portion 136 of the shunt resistor 130 (see FIG. 3D).

In this embodiment, in the same manner as "applying by coating" in (1) (ii), "applying by coating" means all forms of applying by coating including adhesion or fixing of the bonding material 140 to the first lead-out portion 113 and the second lead-out portion 123. In the same manner as (1) (ii), any method may be used for achieving the object of applying by coating such as squeegee printing, spraying or individual painting to portions to be applied by coating.

Figure 3E:
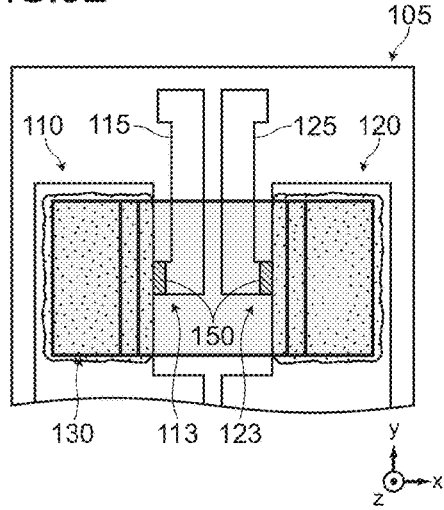
Figure 3F:
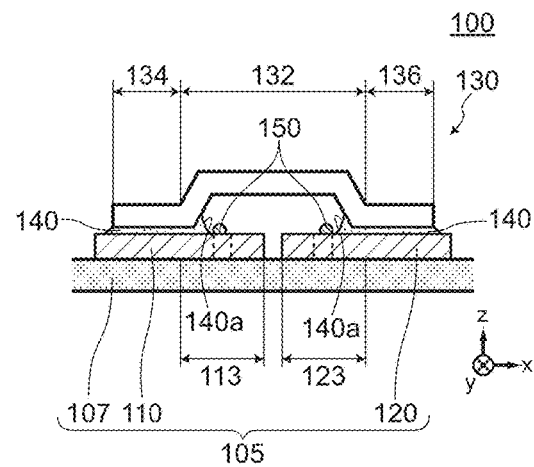

(3) The shunt resistor alignment step S30 is a step of aligning the shunt resistor 130 by making the shunt resistor 130 relatively move with respect to the printed circuit board 105 in a plan view of the xy plane thus making a second land on the second conductive pattern 120 to which the second connecting portion 136 is to be connected and the second connecting portion 136 of the shunt resistor 130 overlap with each other while making a first land on the first conductive pattern 110 to which the first connecting portion 134 is to be connected and the first connecting portion 134 of the shunt resistor 130 overlap with each other (see FIG. 3E).

(4) The bonding step S40 is a step of performing bonding by the bonding material 140 where the bonding material 140 is melted by heating at least the first connecting portion 134, the second connecting portion 136 of the shunt resistor 130, and the first land, the second land, the first lead-out portion 113 and the second lead-out portion 123 of the printed circuit board 105 thus terminating the flow of a fillet 140a of the bonding material 140 at a position corresponding to a position where the bonding material flow-out preventing resist 150 is formed as viewed in a cross section taken along an xz plane (see FIG. 5F).

By performing the above-mentioned manufacturing steps, it is possible to acquire the mounting structure 100 for mounting a shunt resistor according to the embodiment 1.

With respect to processing after the above-mentioned steps, although not shown in the drawings, for example, a power MOSFET, capacitors, general-use resistors and the like are mounted on the printed circuit board 105 besides the shunt resistor 130. Then, the mounting structure 100 for mounting a shunt resistor is connected to a lead frame and, thereafter, the mounting structure 100 for a shunt resistor is sealed with a resin by transfer molding thus manufacturing a power module.

3. Advantageous effects acquired by mounting structure 100 for mounting shunt resistor and method of manufacturing mounting structure 100

(1) According to the mounting structure 100 for mounting a shunt resistor of the embodiment 1, the fillet 140a of the bonding material 140 spreads over the first lead-out portion 113 and the second lead-out portion 123 respectively. Accordingly, in the same manner as the conventional mounting structure for mounting a shunt resistor, the shunt resistor 130 and the conductive patterns 110, 120 can be firmly joined (bonded) and fixed to each other.

(2) According to the mounting structure 100 for mounting a shunt resistor of the embodiment 1, the bonding material flow-out preventing resist 150 is disposed on portions of respective surfaces of the first lead-out portion 113 and the second lead-out portion 123, and the fillet 140a of the bonding material 140 terminates at positions which respectively correspond to the positions where the bonding material flow-out preventing resist 150 is formed. Accordingly, a degree of spreading of the fillet 140a of the bonding material 140 at the first lead-out portion 113 can be controlled within a predetermined range and hence, irregularities in contact area between the fillet 140a and the first lead-out portion 113 can be reduced. Also with such a control, a degree of crawling of the bonding material 140 toward a lower side of the bridging portion 132 can be controlled and hence, irregularities in contact area between the fillet 140a and the lower side of the bridging portion 132 can be also reduced. Irregularities in contact areas can be reduced also in the second lead-out portion 123 in the same manner.

As a result, in the case where the mounting structures for mounting a shunt resistor having the same specification are manufactured on a mass production basis, for example, it is possible to suppress irregularities in a resistance value of a shunt resistor detected through a path reaching the node N2 from the node N1 through: the first pull-out portion; the first lead-out portion; the conductive member; the first connecting portion, the bridging portion and the second connecting portion of the shunt resistor; the conductive member, the second lead-out portion, the second pull-out portion.

Accordingly, the mounting structure 100 for mounting a shunt resistor of the embodiment 1 can achieve both the firm joining (bonding) and fixing of a shunt resistor and the conductive pattern to each other by spreading of a fillet of the bonding material and the suppression of irregularities in a resistance value detected between a first pull-out portion and a second pull-out portion by suppressing irregularities in an area of the fillet of the bonding material by controlling a degree of spreading of the fillet of the bonding material to a lead-out portion.

(3) In the conventional mounting structure 900 for mounting a shunt resistor, as viewed in a cross section of an xz plane, the fillet 940a crawls high to the bridging portion 932 and hence, a cross-sectional area of a space surrounded by the printed circuit board 905, the bonding material 940 (including the fillet 940a) and the shunt resistor 930 is reduced (see FIG. 16B). When the cross-sectional area of such a space is reduced, at the time of performing resin sealing of the mounting structure 900 by transfer molding, a resin minimally flows into such a space and hence, a gap is liable to be formed between the resin and the mounting structure 900 for mounting a shunt resistor. When the gap is formed, durability against heat (for example, generation of heat caused by the flow of an electric current to the shunt resistor 930) is lowered.

In the mounting structure 100 for mounting a shunt resistor according to the embodiment 1, a bonding material flow-out preventing resist 150 is disposed on portions of respective surfaces of the first lead-out portion 113 and the second lead-out portion 123, and the fillet 140a of the bonding material 140 terminates at a position corresponding to a position where the bonding material flow-out preventing resist 150 is disposed. Accordingly, it is possible to sufficiently ensure the cross-sectional area of the space surrounded by the printed circuit board 105, the bonding material 140 (including the fillet 140a) and the shunt resistor 130, and it is also possible to reduce irregularities in the cross-sectional area of the space. Accordingly, in performing the resin sealing of the mounting structure 100 by transfer molding, a resin easily flows into such a space and hence, it is possible to suppress the occurrence of the gap which is formed in the conventional mounting structure 900 for mounting a shunt resistor.

[Embodiment 2]

Figure 4A:
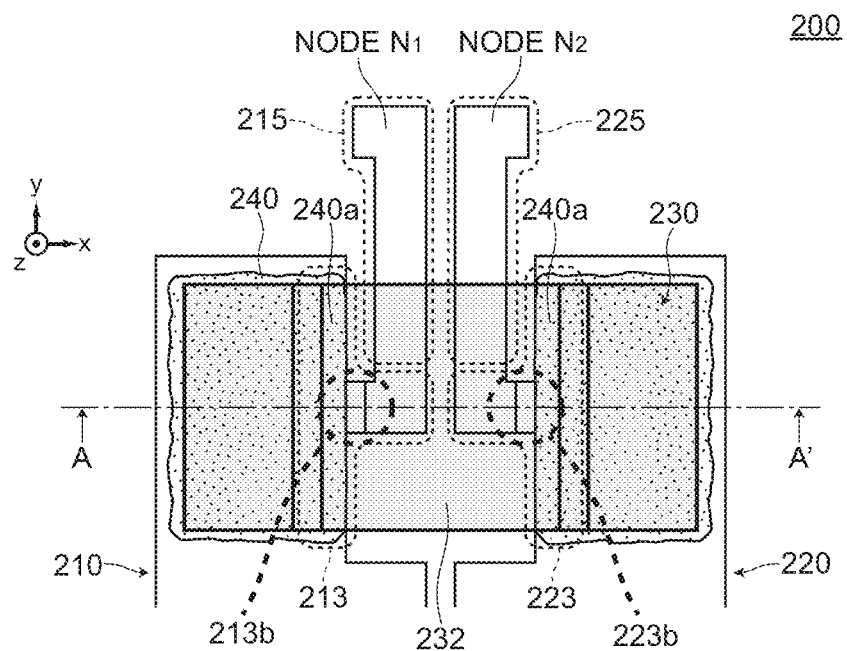
Figure 4B:
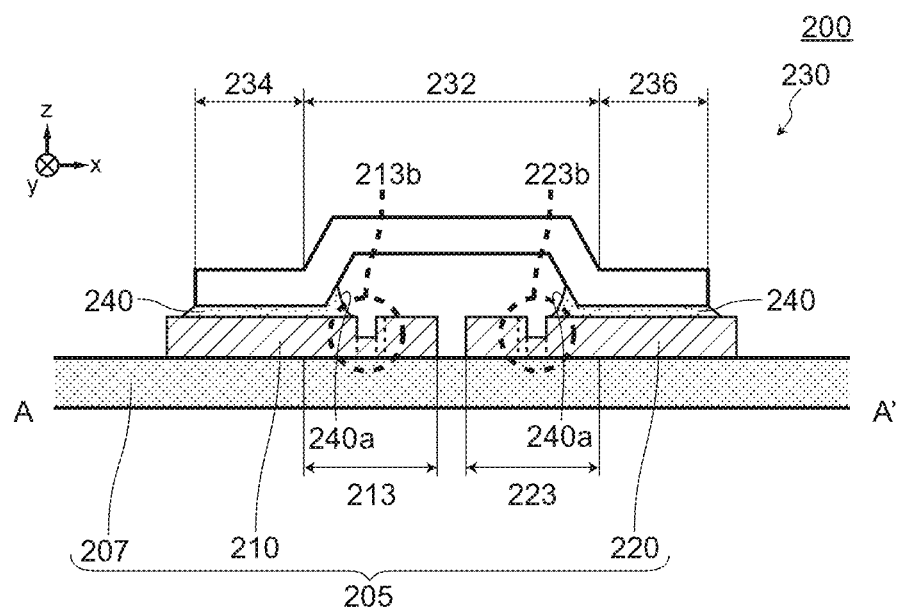

A mounting structure 200 for mounting a shunt resistor according to the embodiment 2 basically has substantially the same configuration as the mounting structure 100 for mounting a shunt resistor according to the embodiment 1. However, the mounting structure 200 for mounting a shunt resistor according to the embodiment 2 differs from the mounting structure 100 for mounting a shunt resistor according to the embodiment 1 with respect to the configuration for terminating a fillet 240a. That is, in the mounting structure 200 for mounting a shunt resistor according to the embodiment 2, as shown in FIG. 4A and FIG. 4B, as viewed in a cross section taken along an xz plane, at least one of a first lead-out portion 213 and a second lead-out portion 223 has portions 213b, 223b (portions indicated by a dotted circle in FIG. 4A and FIG. 4B) where a thickness in a z axis direction changes from a first thickness to a second thickness smaller than the first thickness, and the fillet 240a of a bonding material 240 terminates at a position corresponding to a position of the portion where the first lead-out portion 213 or/and the second lead-out portion 223 has/have the second thickness.

With respect to the portion of the first lead-out portion 213 or/and the second lead-out portion 223 where the thickness becomes the second thickness, it is sufficient that a stepped portion where the thickness becomes the second thickness from the first thickness is formed. For example, such a portion may be formed into a groove shape as shown in FIG. 4A and FIG. 4B, or thicknesses of the lead-out portion and the pull-out portion on a front side of the stepped portion may be maintained at the second thickness.

According to the mounting structure 200 for mounting a shunt resistor of the embodiment 2, at least one of the first lead-out portion 213 and the second lead-out portion 223 has the portions 213b, 223b where a thickness in the z axis direction changes from the first thickness to the second thickness smaller than the first thickness. Accordingly, with respect to the fillet 240a of the bonding material which is melted and intends to spread by wetting to the first lead-out portion 213 and the second lead-out portion 223, spreading by wetting of the fillet 240a is stopped at an edge of the portion (stepped portion) which has the second thickness due to a surface tension of the fillet 240a per se and hence, it is possible to make the fillet 240a terminate at the position corresponding to the position of the portion having the second thickness. With such a configuration, in the same manner as the mounting structure 100 for mounting a shunt resistor according to the embodiment 1, in the mounting structure 200 for mounting a shunt resistor according to the embodiment 2, a degree of spreading of the fillet 240a can be controlled within a predetermined range and hence, irregularities in contact area between the fillet 240a and the first lead-out portion 213 and the second lead-out portion 223 can be reduced. Also with such a control, a degree of crawling of the bonding material 240 toward a lower side of the bridging portion 232 can be controlled and hence, irregularities in contact area between the fillet 240a and the lower side of the bridging portion 232 can be also reduced. As a result, irregularities in a resistance value detected between the first pull-out portion and the second pull-out portion can be suppressed.

Further, according to the mounting structure 200 for mounting a shunt resistor of the embodiment 2, a degree of spreading of a fillet can be controlled without using a bonding material flow-out preventing resist. Accordingly, a member for forming the bonding material flow-out preventing resist and a bonding material flow-out preventing resist applying step can be reduced or deleted and hence, the mounting structure 200 for mounting a shunt resistor of the embodiment 2 can enjoy an economical merit. Further, an organic substance (in a case where the bonding material flow-out preventing resist contains the organic substance) is not used and hence, it is not necessary to considerably take into account the adhesion of the fillet with a sealing resin and the generation of a gas from an organic substance.

The mounting structure 200 for mounting a shunt resistor according to the embodiment 2 has substantially the same configuration as the mounting structure 100 for mounting a shunt resistor according to the embodiment 1 except for the configuration for terminating the fillet 240a. Accordingly, the mounting structure 200 for mounting a shunt resistor according to the embodiment 2 acquires the advantageous effects corresponding to substantially the same configuration among the advantageous effects which the mounting structure 100 for mounting a shunt resistor according to the embodiment 1 possesses.

[Embodiment 3]

A mounting structure 300 for mounting a shunt resistor according to the embodiment 3 basically has substantially the same configuration as the mounting structure 100 for mounting a shunt resistor according to the embodiment 1. However, the mounting structure 300 for mounting a shunt resistor according to the embodiment 3 differs from the mounting structure 100 for mounting a shunt resistor according to the embodiment 1 with respect to the configuration for terminating a fillet 340a. That is, in the mounting structure 300 for mounting a shunt resistor according to the embodiment 3, as shown in FIG. 5A and FIG. 5B, as viewed in a plan view of the xy plane, the first lead-out portion 313 and the second lead-out portion 323 have portions 313a, 323a (portions indicated by a dotted circle in FIG. 5A and FIG. 5B) where a width in a y axis direction changes from a first width W1 to a second width W2 narrower than the first width W1, and the fillet 340a of the bonding material 340 terminates at a position corresponding to a position of a portion where the first lead-out portion 313 or/and the second lead-out portion 323 has/have the second width W2 as viewed in a cross section taken along an xz plane.

Figure 5A:
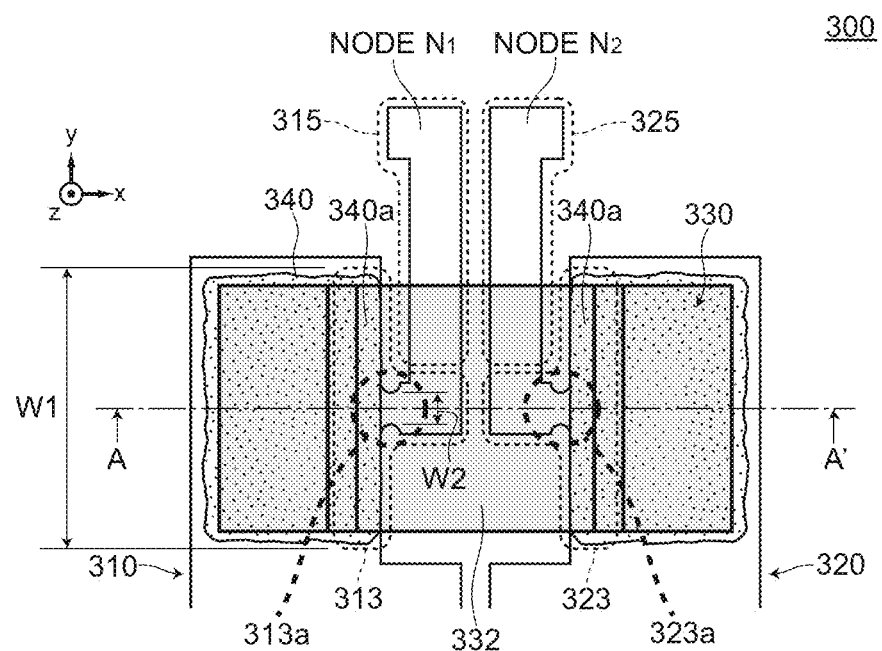
Figure 5B:
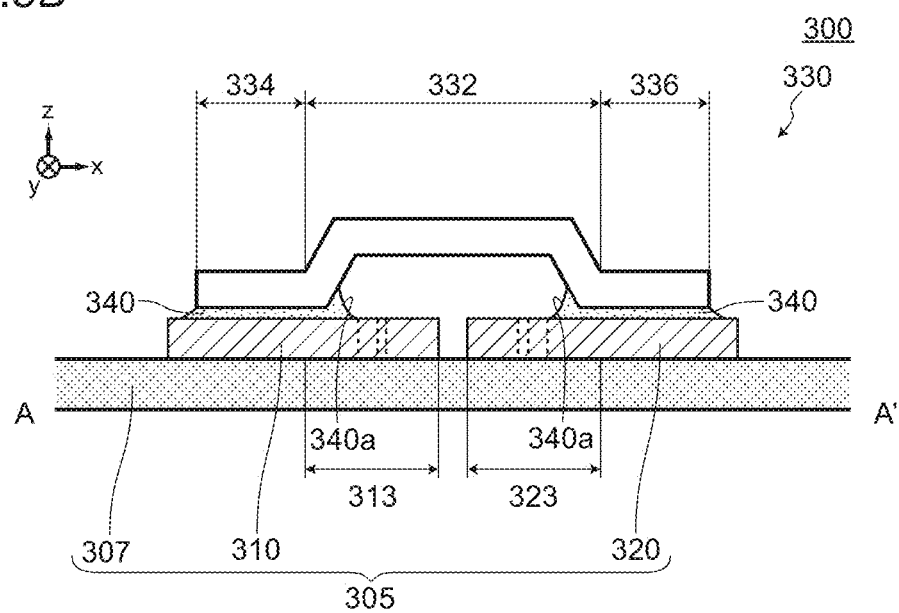

Portions of the first lead-out portion 313 or/and the second lead-out portion 323 where the width becomes the second width W2 may be formed into a bottle-neck shape as shown in FIG. 5A. Further, when the second width W2 is a width of a degree which prevents spreading by wetting of the melted bonding material 340 due to a surface tension of the bonding material 340 per se, the portion where the width becomes the second width W2 may be formed into a straight shape in place of a bottle-neck shape as in the case of the first lead-out portion 113 and the second lead-out portion 123 shown in FIG. 1A.

According to the mounting structure 300 for mounting a shunt resistor of the embodiment 3, at least one of the first lead-out portion 313 and the second lead-out portion 323 has portions 313a, 323a where a width in a y axis direction changes from the first width W1 to the second width W2 narrower than the first width W1. Accordingly, with respect to the fillet 340a of the bonding material which is melted and intends to spread by wetting to the first lead-out portion 313 and the second lead-out portion 323, spreading by wetting of the fillet 340a is stopped in front of a portion where the width becomes the second width W2 (necked portion) or in the vicinity of a boundary due to a surface tension of the fillet 340a per se and hence, it is possible to make the fillet 340a terminate at the position corresponding to the position of the portion having the second width W2. With such a configuration, in the same manner as the mounting structure 100 for mounting a shunt resistor according to the embodiment 1, in the mounting structure 300 for mounting a shunt resistor according to the embodiment 3, a degree of spreading of the fillet 340a can be controlled within a predetermined range and hence, irregularities in contact area between the fillet 340a and the first lead-out portion 313 and the second lead-out portion 323 can be reduced. Also with such a control, a degree of crawling of the bonding material 340 toward a lower side of the bridging portion 332 can be controlled and hence, irregularities in contact area between the fillet 340a and the lower side of the bridging portion 332 can be also reduced. As a result, irregularities in a resistance value detected between the first pull-out portion and the second pull-out portion can be suppressed.

Further, according to the mounting structure 300 for mounting a shunt resistor of the embodiment 3, a degree of spreading of a fillet can be controlled without using a bonding material flow-out preventing resist. Accordingly, in the same manner as the mounting structure 200 for mounting a shunt resistor according to the embodiment 2, the mounting structure 300 for mounting a shunt resistor of the embodiment 3 can enjoy an economical merit, and there arises no problem with respect to the adhesion of the fillet with a sealing resin and the generation of a gas from an organic substance. Further, a step of erasing the first lead-out portion 313 and the second lead-out portion 323 in a thickness direction (−z axis direction) for establishing the mounting structure 200 for mounting a shunt resistor of the embodiment 2 becomes unnecessary and hence, the first lead-out portion 313 and the second lead-out portion 323 can be formed only by a pattern designing on a plane (xy plane) whereby a first conductive pattern 310 and a second conductive pattern 320 can be formed in the same step. Accordingly, the mounting structure 300 for mounting a shunt resistor according to the embodiment 3 can enjoy a more economical merit than the mounting structure 200 for mounting a shunt resistor according to the embodiment 2.

The mounting structure 300 for mounting a shunt resistor according to the embodiment 3 has substantially the same configuration as the mounting structure 100 for mounting a shunt resistor according to the embodiment 1 except for the configuration for terminating the fillet 340a. Accordingly, the mounting structure 300 for mounting a shunt resistor according to the embodiment 3 acquires the advantageous effects corresponding to substantially the same configuration among the advantageous effects which the mounting structure 100 for mounting a shunt resistor according to the embodiment 1 possesses.

[Embodiment 4]

A mounting structure 400 for mounting a shunt resistor according to the embodiment 4 basically has substantially the same configuration as the mounting structure 100 for mounting a shunt resistor according to the embodiment 1. However, the mounting structure 400 for mounting a shunt resistor according to the embodiment 4 differs from the mounting structure 100 for mounting a shunt resistor according to the embodiment 1 with respect to a point that the flowout of a bonding material 440 can be controlled at portions other than a first lead-out portion 413 and a second lead-out portion 423. That is, in the mounting structure 400 for mounting a shunt resistor according to the embodiment 4, as shown in FIG. 6A and FIG. 6B, as viewed in a plan view of the xy plane, a bonding material flow-out preventing resist 450A is further provided outside a region which a shunt resistor 430 occupies in a first conductive pattern 410 or a second conductive pattern 420.

Figure 6A:
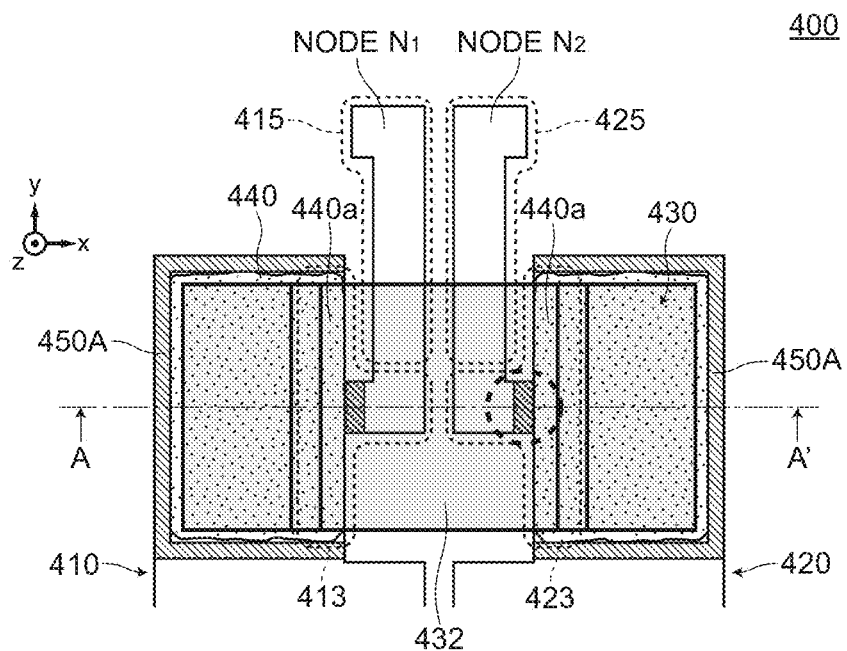
Figure 6B:
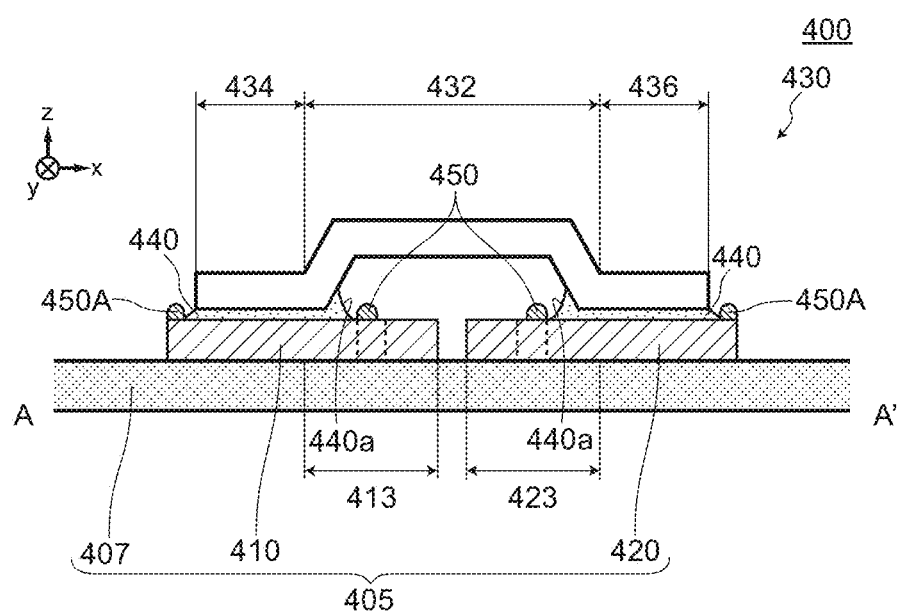

As the mounting structure 400 for mounting a shunt resistor according to the embodiment 4, in FIG. 6A and FIG. 6B, an example is illustrated where the configuration of the embodiment 4 (addition of the bonding material flow-out preventing resist 450A) is provided in addition to the bonding material flow-out preventing resist 150 having a strip shape in the embodiment 1 (see FIG. 1B). However, the bonding material flow-out preventing resist 450A can be further provided outside the region which the shunt resistor occupies also with respect to the structure of the stepped portion in the embodiment 2 (see FIG. 4A and FIG. 4B), the structure of the necked portion in the embodiment 3 (see FIG. 5A and FIG. 5B) and the like besides the above-mentioned structure.

In the mounting structure 400 for mounting a shunt resistor according to the embodiment 4, as viewed in a plan view of the xy plane, the bonding material flow-out preventing resist 450A is further provided outside a region which the shunt resistor 430 occupies in the first conductive pattern 410 or the second conductive pattern 420. Accordingly, in aligning the shunt resistor 430 with a printed circuit board 405, the bonding material flow-out preventing resists 450A applied to both sides in an x axis direction (a first connecting portion 434 side and a second connecting portion 436 side) by coating can be set as targets of alignment and hence, accuracy of alignment can be increased as in the case of so-called self alignment. As a reference, when accuracy of alignment is low, an area where a lead-out portion of a conductive pattern is exposed (lead-out portion not covered by a connecting portion of the shunt resistor) differs between a first lead-out portion side and a second lead-out portion side. This causes irregularities in size of a fillet leading to irregularities in a detected resistance value of the shunt resistor. According to the mounting structure 400 for mounting a shunt resistor of the embodiment 4, accuracy of alignment can be increased and hence, such a drawback can be suppressed.

Further, according to the mounting structure 400 for mounting a shunt resistor of the embodiment 4, assuming that, for example, an amount of bonding material 440 applied by coating to a land portion on which the first connecting portion 434 is to be mounted, is fixed, an amount of the bonding material 440 which leaks to the outside of a region which overlaps with the shunt resistor 430 can be controlled within a fixed range. As a result, an amount of bonding material 440 which spreads by wetting to the inside (the first lead-out portion 413 and the second lead-out portion 423) can be also controlled within a fixed range.

The mounting structure 400 for mounting a shunt resistor according to the embodiment 4 has substantially the same configuration as the mounting structure 100 for mounting a shunt resistor according to the embodiment 1 except for the configuration where the flowout of the bonding member 440 can be controlled in portions other than the first lead-out portion 413 and the second lead-out portion 423. Accordingly, the mounting structure 400 for mounting a shunt resistor according to the embodiment 4 acquires the advantageous effects corresponding to substantially the same configuration among the advantageous effects which the mounting structure 100 for mounting a shunt resistor according to the embodiment 1 possesses.

[Embodiment 5]

A mounting structure 500 for mounting a shunt resistor according to the embodiment 5 basically has substantially the same configuration as the mounting structure 400 for mounting a shunt resistor according to the embodiment 4. However, the mounting structure 500 for mounting a shunt resistor according to the embodiment 5 differs from the mounting structure 400 for mounting a shunt resistor according to the embodiment 4 with respect to a point that a bonding material flow-out preventing resist continuously surrounds connecting portions (a first connecting portion 534 and a second connecting portion 536). That is, in the mounting structure 500 for mounting a shunt resistor according to the embodiment 5, as shown in FIG. 7A and FIG. 7B, as viewed in a plan view of an xy plane, a bonding material flow-out preventing resist 550A is further provided outside a region which a shunt resistor 530 occupies in a first conductive pattern 510 or/and a second conductive pattern 520, and a bonding material flow-out preventing resist 550 disposed inside the region which the shunt resistor 530 occupies and the bonding material flow-out preventing resist 550A disposed outside the region which the shunt resistor 530 occupies are continuously formed with each other.

Figure 7A:
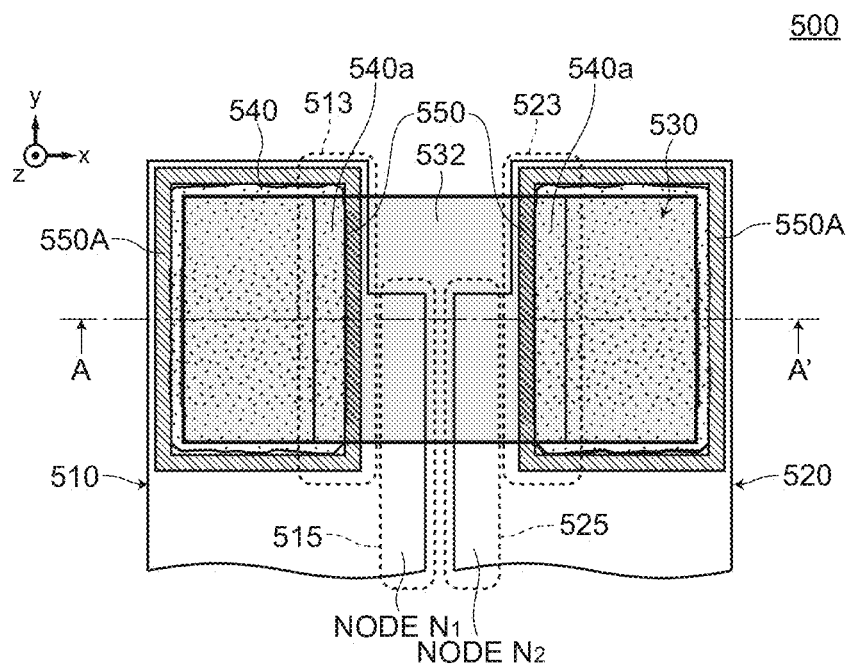
Figure 7B:
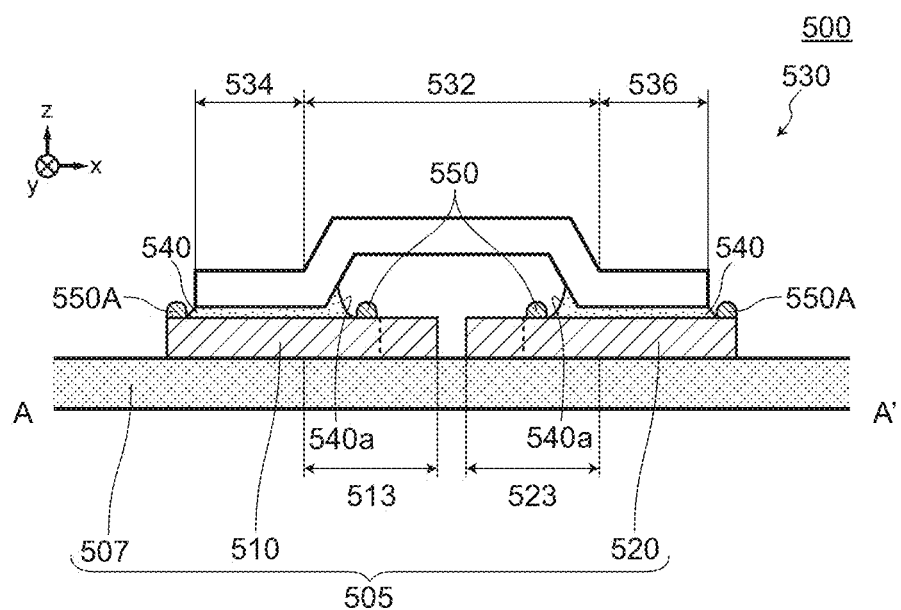

In the mounting structure 500 for mounting a shunt resistor according to the embodiment 5, as shown in FIG. 7A and FIG. 7B, the bonding material flow-out preventing resist 550 disposed inside the region which the shunt resistor 530 occupies and the bonding material flow-out preventing resist 550A disposed outside the region which the shunt resistor 530 occupies are formed continuously in a closed manner without interruption at any portions. That is, the bonding material flow-out preventing resist 550 and the bonding material flow-out preventing resist 550A are configured to completely surround the connecting portion (the first connecting portion 534 or the second connecting portion 536).

However, the present invention is not limited to such a configuration, and the bonding material flow-out preventing resist 550 and the bonding material flow-out preventing resist 550A may be configured such that these bonding material flow-out preventing resists 550, 550A are discontinued partially or do not completely surround the connecting portion (the first connecting portion 534 or the second connecting portion 536) provided that the flow-out of spreading by wetting of the bonding material 540 can be controlled.

In the mounting structure 500 for mounting a shunt resistor according to the embodiment 5, the bonding material flow-out preventing resist 550 disposed inside the region which the shunt resistor 530 occupies and the bonding material flow-out preventing resist 550A disposed outside the region which the shunt resistor 530 occupies are continuously formed with each other. With such a configuration, it is possible to temporarily prevent leaking of the bonding material 540 to the outside in four directions (the +x direction, the −x direction, the +y direction and the −y direction) in the region which overlaps with the shunt resistor 530 and hence, an amount of the bonding material 540 which spreads by wetting to the inside (the first lead-out portion 513 and the second lead-out portion 523) of the shunt resistor 530 can be also controlled within a fixed range eventually.

The mounting structure 500 for mounting a shunt resistor according to the embodiment 5 has substantially the same configuration as the mounting structure 400 for mounting a shunt resistor according to the embodiment 4 except for a point that the bonding material flow-out preventing resist continuously surrounds connecting portions (the first connecting portion 534 and the second connecting portion 536). Accordingly, the mounting structure 500 for mounting a shunt resistor according to the embodiment 5 acquires the advantageous effects corresponding to substantially the same configuration among the advantageous effects which the mounting structure 400 for mounting a shunt resistor according to the embodiment 4 possesses.

[Experimental Example]

As a result of the evaluation acquired by an experiment, it is found that the mounting structure for mounting a shunt resistor according to the present invention can suppress irregularities in a detected resistance value compared to the conventional mounting structure for mounting a shunt resistor. The experiment is described hereinafter.

1. Preparation of Specimens

Amounting structure for mounting a shunt resistor having substantially the same configuration as the mounting structure 400 for mounting a shunt resistor according to the embodiment 4 (see FIG. 6A and FIG. 6B) is prepared as a specimen 1 (example).

A mounting structure for mounting a shunt resistor having substantially the same configuration as the conventional mounting structure 900 for mounting a shunt resistor (see FIG. 16A and FIG. 16B) is prepared as a specimen 2 (comparison example).

2. Method of Experiment (1) A plurality of specimens 1 (examples) are manufactured, and a population A is formed of the plurality of specimens 1. In the same manner, a plurality of specimens 2 (comparison examples) are manufactured, and a population B is formed of the plurality of specimens 2. All shunt resistors (resistance elements) are manufactured using materials having the same resistance value.

(2) With respect to the respective specimens 1 (examples) belonging to the population A, a resistance value detected between a first pull-out portion and a second pull-out portion is acquired by the same measuring method using the same measuring instrument. Also with respect to the respective specimens 2 (comparison examples) belonging to the population B, a resistance value detected by measurement is acquired in the same manner. Since measuring instrument, the measuring method and the like are confidential information and hence, such information is not specifically disclosed in this specification.

3. Result of Experiment

Figure 8:
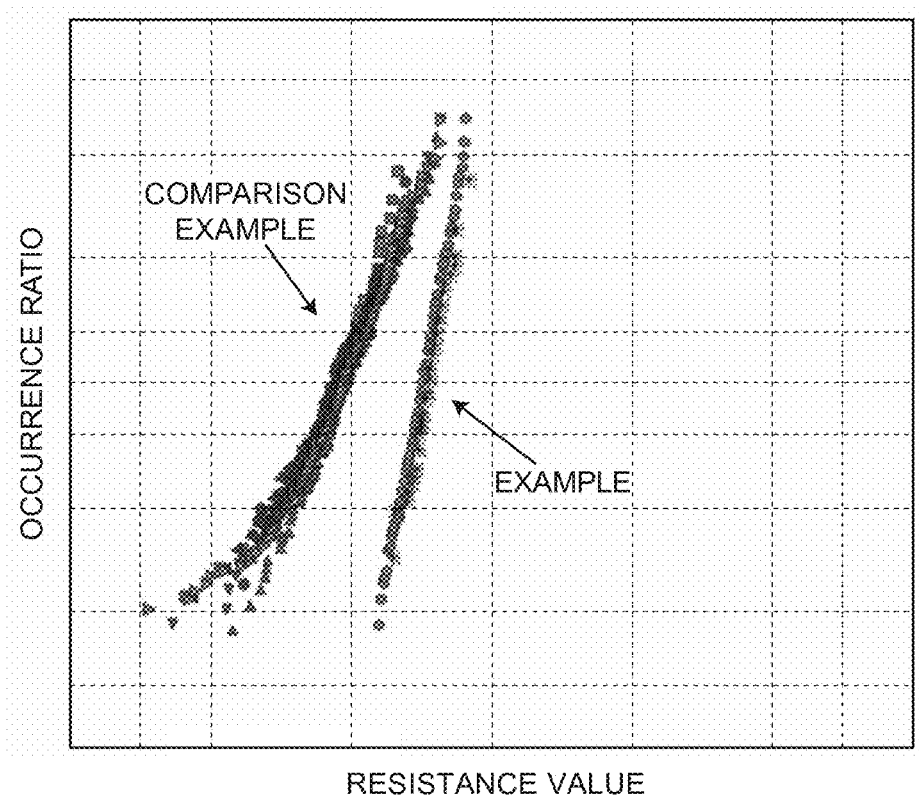
FIG. 8 is a graph describing a result of evaluation on a mounting structure for mounting a shunt resistor according to an experimental example. In the graph, a cumulative probability distribution of resistance values detected with respect to the mounting structure for mounting a shunt resistor is plotted. The resistance value is taken on an axis of abscissas, and an occurrence ratio is taken on an axis of ordinates.

The result of the experiment is shown in FIG. 8. FIG. 8 is a graph where a cumulative probability distribution is plotted with respect to a plurality of resistance values of the respective specimens 1 (examples) and the specimens 2 (comparison examples) acquired in accordance with the above-mentioned method. In the graph, the resistance value is taken on an axis of abscissas, and an occurrence ratio is taken on an axis of ordinates.

It is understood from FIG. 8 that the resistance values are plotted in a wide range on an axis of abscissas (large irregularities) in the comparison examples, while the resistance values are plotted in a range on an axis of abscissas narrower than the corresponding range of the comparison examples (smaller irregularities).

With such an experiment, it is confirmed that the mounting structure for mounting the shunt resistor according to the present invention can suppress irregularities in a resistance value detected between the first pull-out portion and the second pull-out portion than the conventional mounting structure for mounting a shunt resistor.

Although the present invention has been described in conjunction with the above-mentioned embodiments heretofore, the present invention is not limited to the above-mentioned embodiments. Various modifications can be carried out without departing from the gist of the present invention, and the following modifications are conceivable, for example.

Figure 9A:
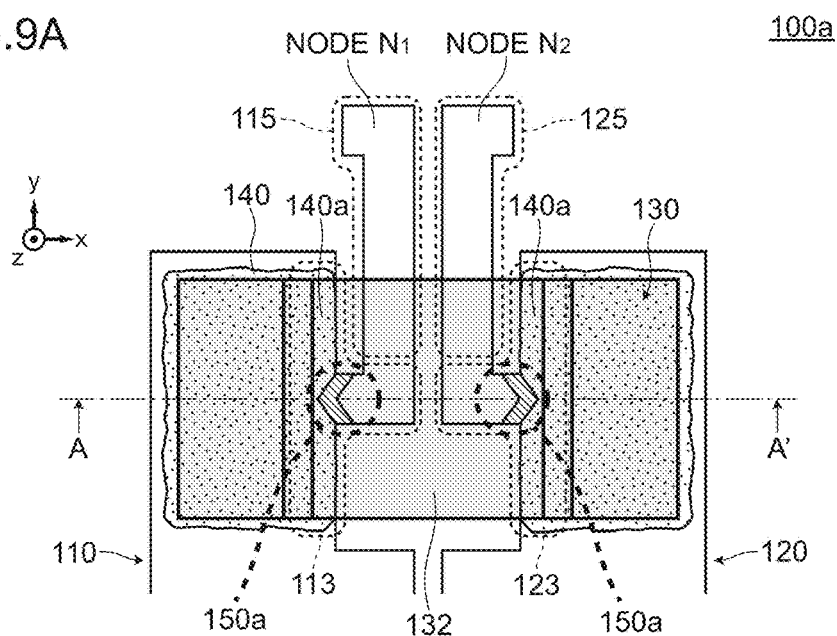
FIG. 9A to FIG. 9C are views for describing a mounting structure 100a for mounting a shunt resistor according to a modification 1.
Figure 9B:
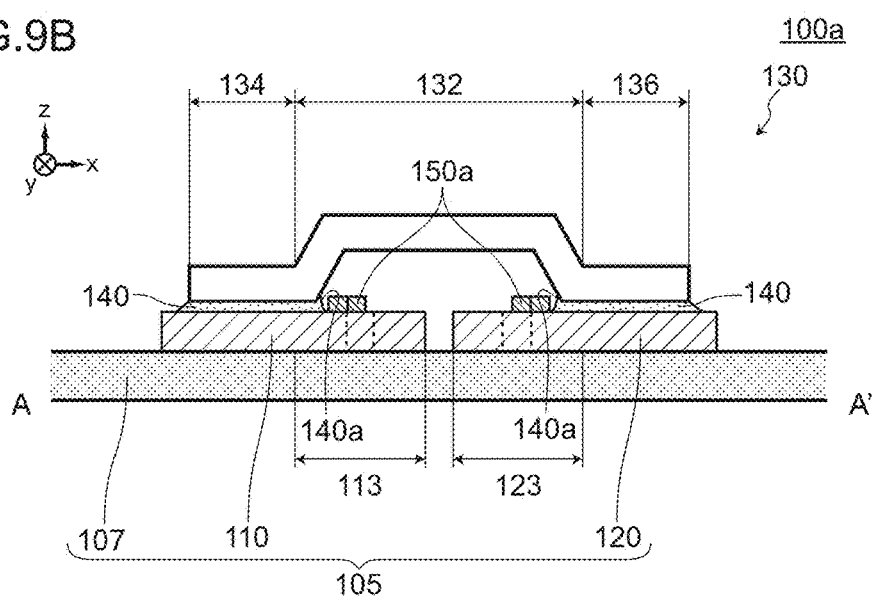
Figure 9C:
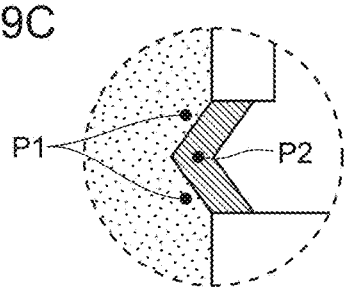

(1) In the embodiment 1, the bonding material flow-out preventing resist 150 having a strip shape is adopted as a pattern of the bonding material flow-out preventing resist 150. However, the bonding material flow-out preventing resist 150 is not limited to the bonding material flow-out preventing resist 150 having a strip shape. As shown in FIG. 9A to FIG. 9C, the present invention can adopt a bonding material flow-out preventing resist 150a having an L-shaped pattern, or dogleg-shaped pattern, as viewed in a plan view of an xy plane, and the bonding material flow-out preventing resist 150a is disposed such that a crest P2 of a bent portion of the L-shaped pattern is brought into contact with a bonding material 140.

With such a configuration, spreading by wetting of a fillet 140a can be limited by a portion (biting portion) at the crest P2 of the bent portion of the L-shaped pattern. On the other hand, portions of the fillet 140a at positions P1 (see FIG. 9C) function as portions for firmly joining (bonding) and fixing a shunt resistor 130 and a conductive pattern (a first lead-out portion 113 or a second lead-out portion 123). Accordingly, it is possible to achieve both a control of the fillet and the joining of the shunt resistor and the conductive pattern.

Figure 10A:
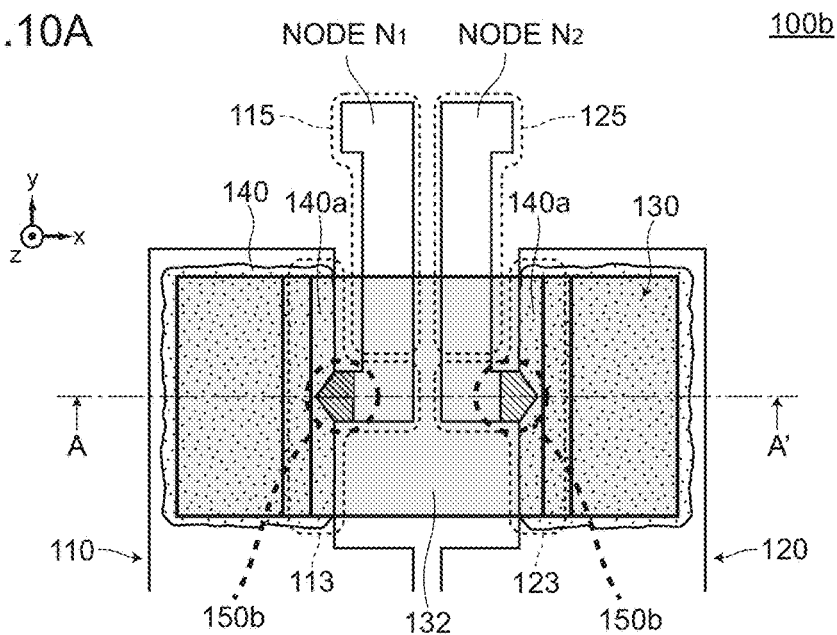
FIG. 10A is a plan view of the mounting structure 100b for mounting a shunt resistor as viewed on an xy plane and FIG. 10B is a cross-sectional view taken along a line A-A' in FIG. 10A.
Figure 10B:
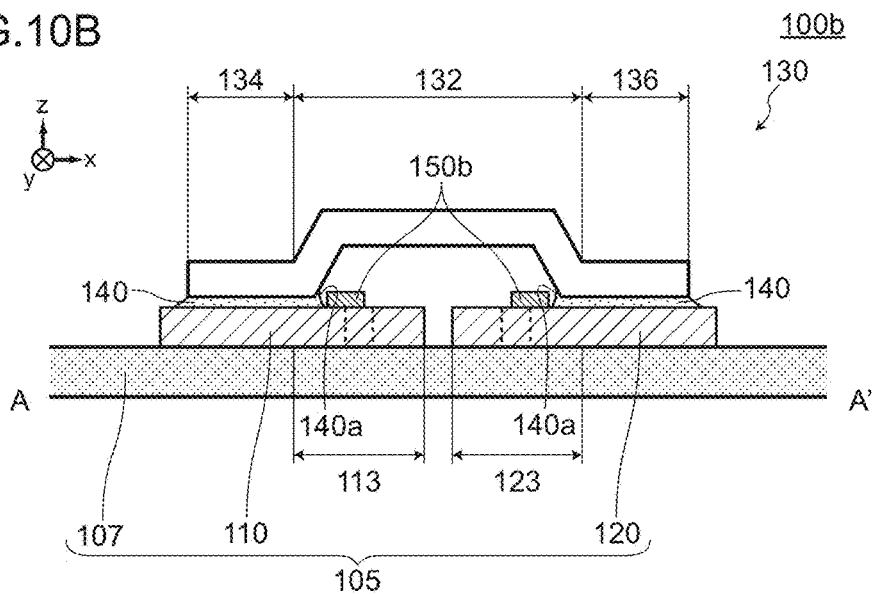
Figure 10C:
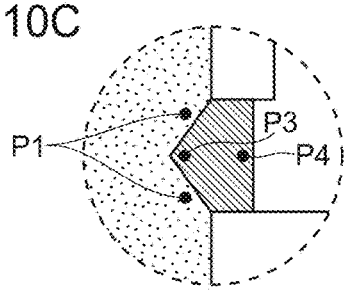
FIG. 10C is an enlarged view of a portion surrounded by a dotted line in FIG. 10A.

(2) In the same manner, as a pattern of the bonding material flow-out preventing resist, as shown in FIG. 10A to FIG. 10C, the present invention can adopt a bonding material flow-out preventing resist 150b having a home-base-shape pattern as viewed in a plan view of an xy plane, and the bonding material flow-out preventing resist 150b is disposed such that an acute-angled crest P3 of the home-base pattern is brought into contact with a bonding material 140.

With such a configuration, in the same manner as the bonding material flow-out preventing resist 150a having an L shape, spreading by wetting of a fillet 140a can be limited by a portion (biting portion) at the acute-angled crest P3 of the home-base pattern. On the other hand, portions of the fillet 140a at positions P1 (see FIG. 10C) function as portions for firmly joining (bonding) and fixing a shunt resistor 130 and a conductive pattern (a first lead-out portion 113 or a second lead-out portion 123). Further, even when the bonding material 140 passes over the acute-angled crest P3 of the bonding material flow-out preventing resist 150b and spreads as in the case where an amount of the bonding material 140 is excessively large, the case where displacement of alignment of a shunt resistor 130 occurs or the like, since the resist is stacked to a portion P4 and hence, it is possible to prevent the bonding material 140 from flowing out to the opposite side. Further, when the bonding material flow-out preventing resist 150b has a home-base-shape, for example, in the case where a squeegee printing method is used in a bonding material flow-out preventing resist applying step, the bonding material flow-out preventing resist 150b having a home-base-shaped has a large pattern area compared to the bonding material flow-out preventing resist having an L shape and hence, the bonding material flow-out preventing resist 150b can be surely printed.

Figure 11A:
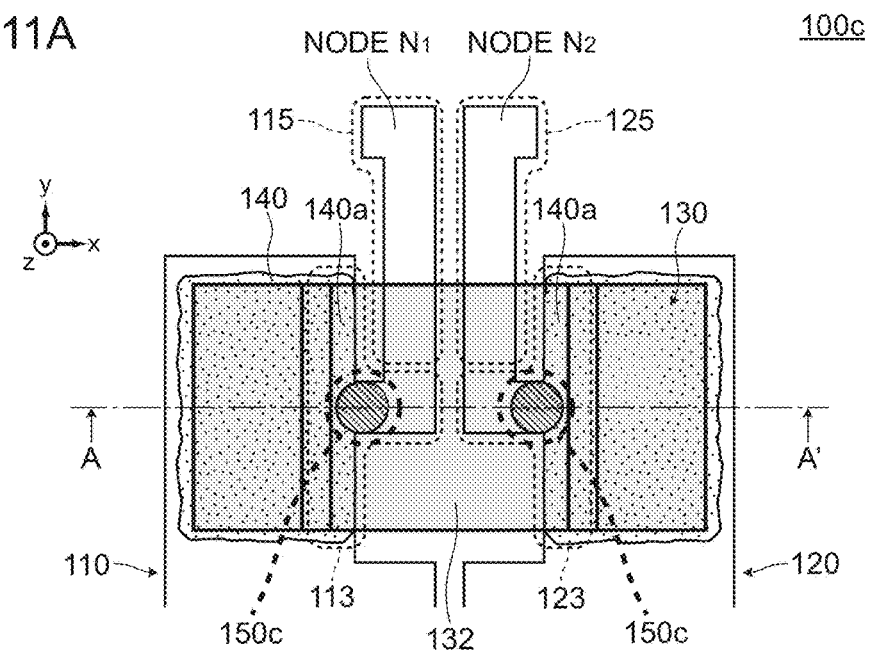
FIG. 11A to FIG. 11C are views for describing a mounting structure 100c for mounting a shunt resistor according to a modification 3.
Figure 11B:
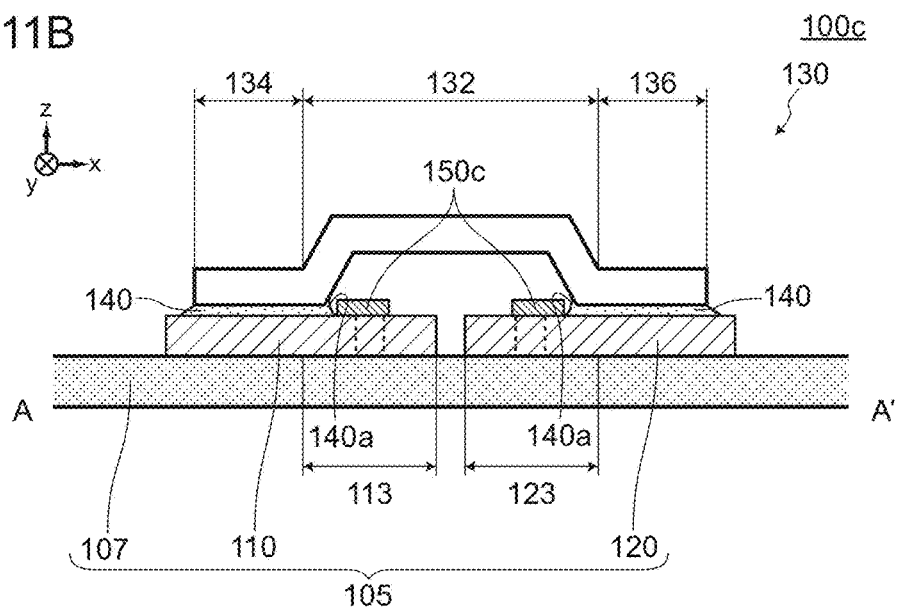
Figure 11C:
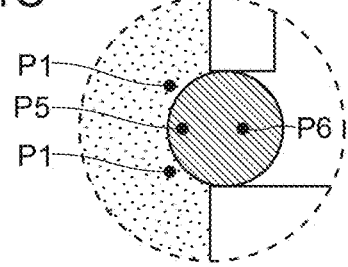

(3) In the same manner, as a pattern of the bonding material flow-out preventing resist, as shown in FIG. 11A to FIG. 11C, the present invention can adopt a bonding material flow-out preventing resist 150c having an elliptical or circular pattern in a plan view of an xy plane.

With such a configuration, in the same manner as the above-mentioned bonding material flow-out preventing resist 150a having an L shape and the bonding material flow-out preventing resist 150b having a home-base-shaped, spreading by wetting of a fillet 140a can be limited by a portion (biting portion) at a position P5. On the other hand, portions of the fillet 140a at positions P1 (see FIG. 11C) function as portions for firmly joining (bonding) and fixing a shunt resistor 130 and a conductive pattern (a first lead-out portion 113 or a second lead-out portion 123). Further, when the bonding material flow-out preventing resist 150c has an elliptical or circular shape, in the case where a squeegee printing method is used in a bonding material flow-out preventing resist applying step, the bonding material flow-out preventing resist 150c can be printed in a most stable manner.

(4) In the modifications (1) to (3), the bonding material flow-out preventing resist and a connecting portion (a first connecting portion 134, a second connecting portion 136) of the shunt resistor have the arrangement relationship where the bonding material flow-out preventing resist and the connecting portion of the shunt resistor do not directly interfere with each other. However, the arrangement relationship is not limited to such a relationship. As shown in FIG. 12, a portion (a portion at the crest P3 in FIG. 12B and FIG. 12C, for example) of the bonding material flow-out preventing resist 150b on a bonding material 140 side may be configured to interfere with the connecting portions (the first connecting portion 134, the second connecting portion 136) of the shunt resistor. That is, a portion (P3) of the bonding material flow-out preventing resist 150b may be configured to be in contact with a lower surface of the first connecting portion 134 of the shunt resistor 130 or a lower surface of the second connecting portion 136 of the shunt resistor 130 in an overlapping manner.

Figure 12A:
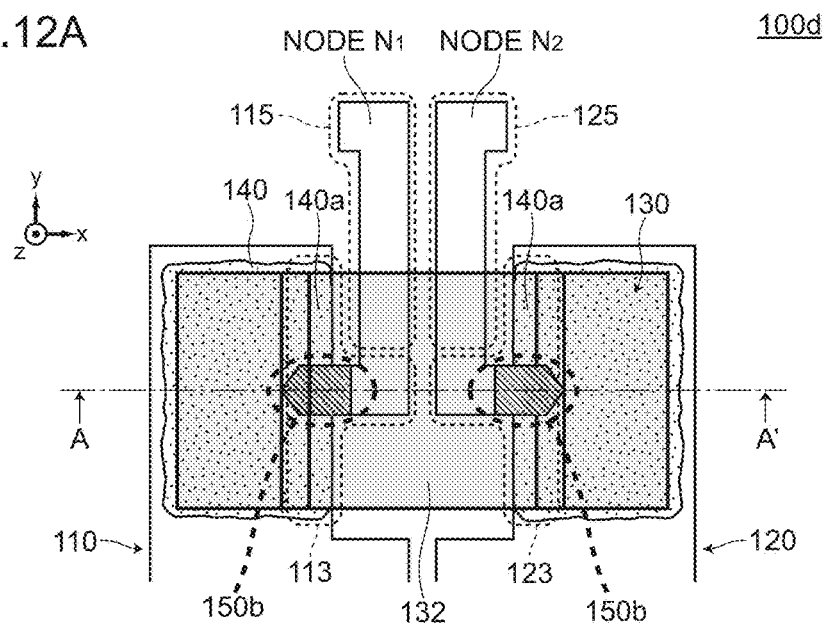
FIG. 12A to FIG. 12C are views for describing a mounting structure 100d for mounting a shunt resistor according to a modification 4.
Figure 12B:
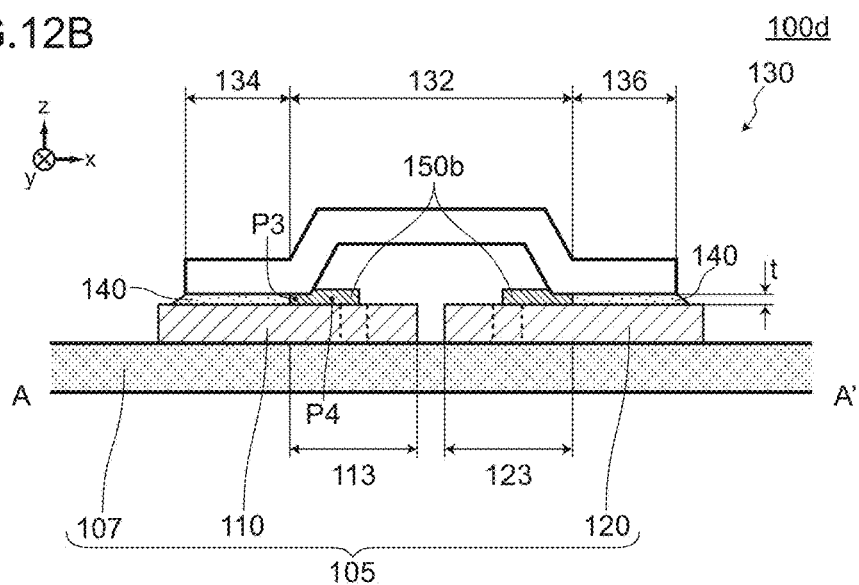
Figure 12C:
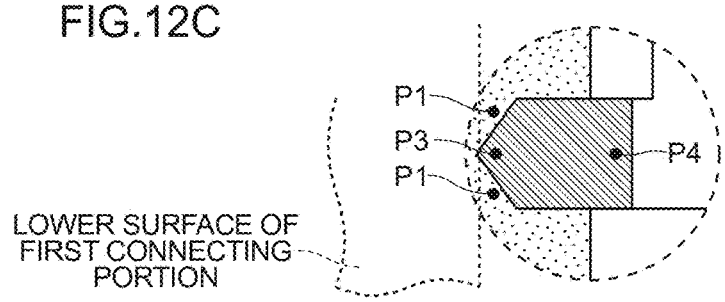

The example is described where the above-mentioned positional relationship is applied to the case where the bonding material flow-out preventing resist having a home-base-shape (modification (2)) is used in FIG. 12A to FIG. 12C. However, the above-mentioned positional relationship may be applied to the case where the bonding material flow-out preventing resist having an L shape is adopted (modification (1)) or the case where the bonding material flow-out preventing resist having an elliptical or circular shape is adopted (modification (3)).

With the mounting structure 100d for mounting a shunt resistor according to such a modification, for example, a gap thickness t between a land portion on which the first connecting portion 134 of the first conductive pattern 110 is to be mounted and a lower surface of the first connecting portion 134 is determined depending on a thickness of the portion (P3) of the bonding material flow-out preventing resist 150b.

Accordingly, a thickness of the bonding material 140 when the bonding material 140 flows into the gap also becomes a fixed value and hence, eventually, it is possible to suppress irregularities in a degree of spreading of the fillet 140a.

Figure 13A:
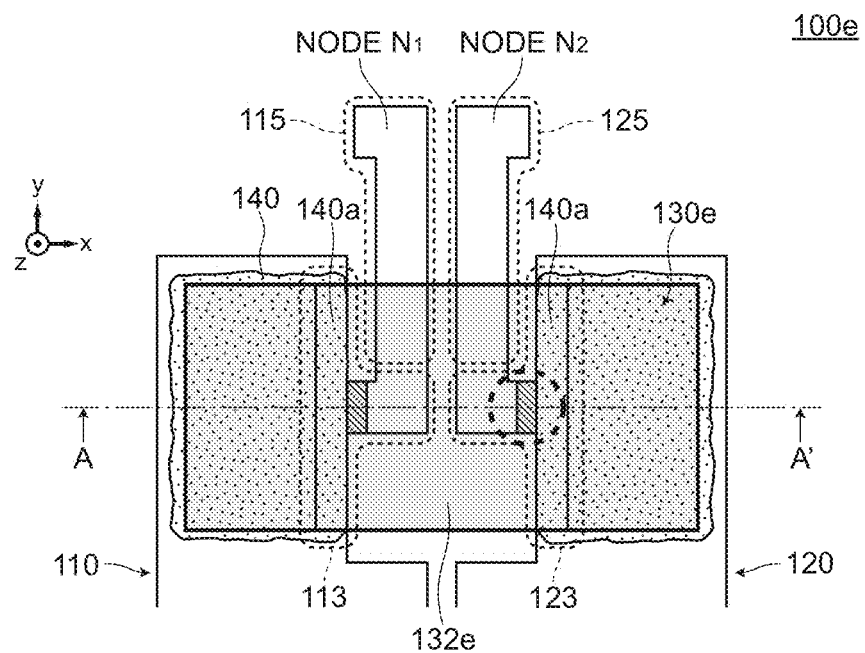
FIG. 13A and FIG. 13B are views for describing a mounting structure 100e for mounting a shunt resistor according to a modification 5.
Figure 13B:
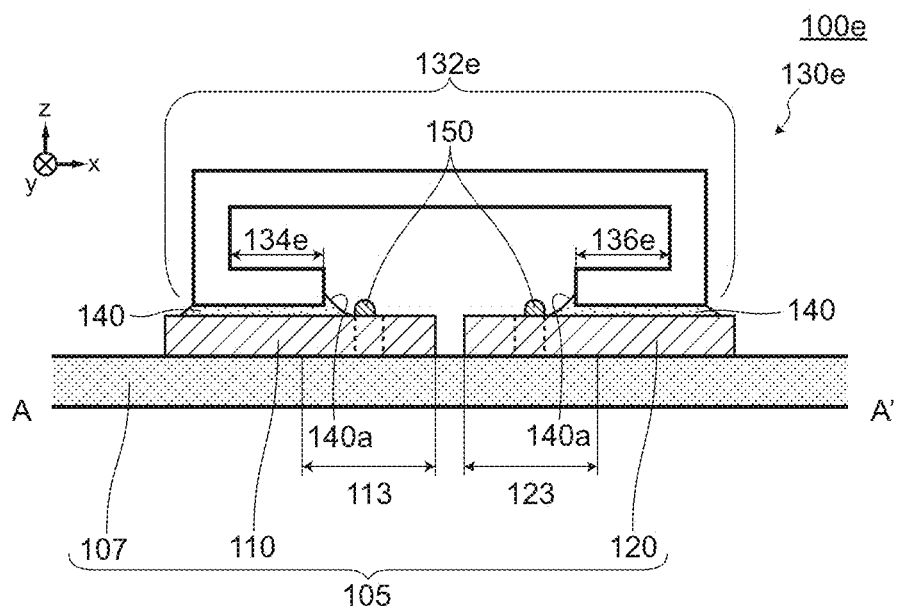
Figure 14:
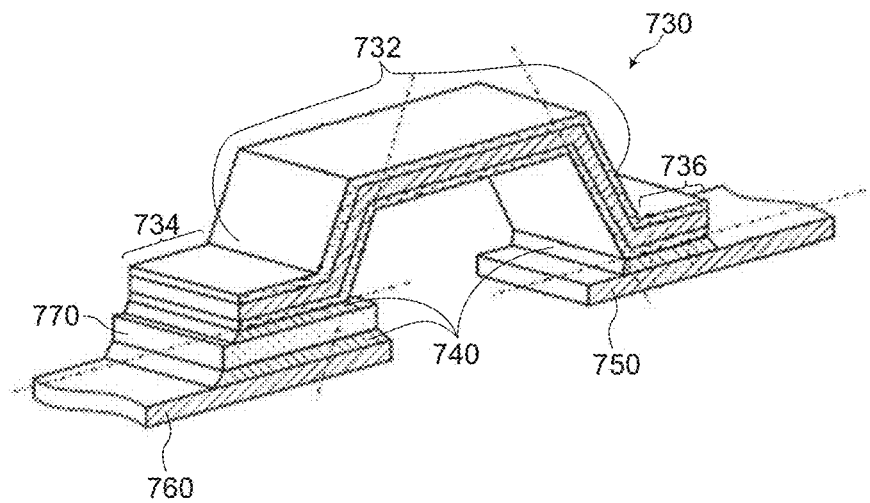
FIG. 14 is a perspective view for describing a shunt resistor 730 of Background Art.
Figure 15A:
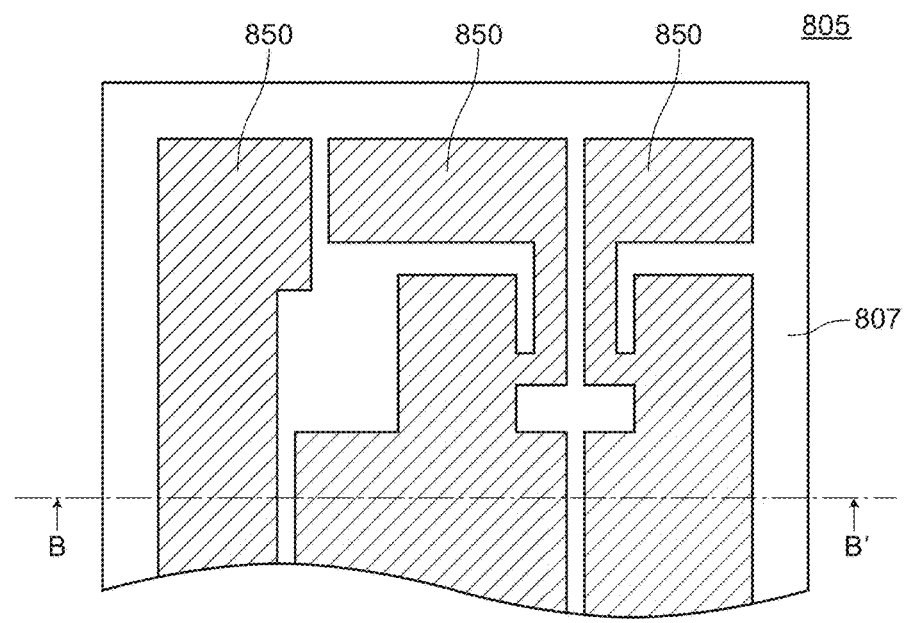
FIG. 15A and FIG. 15B are views for describing a DCB substrate 805 of Background Art.
Figure 15B:
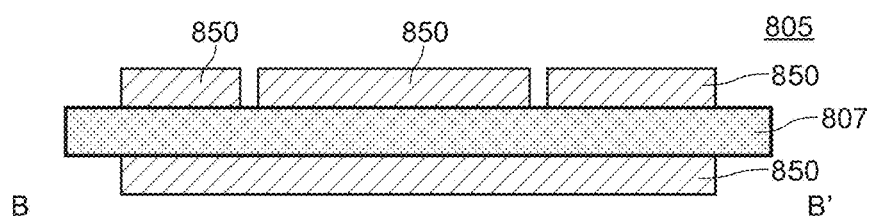

(5) In the embodiments 1 to 5, as a shunt resistor, the shunt resistor is used where the connecting portions are arranged to be directed outward (see FIG. 1A or the like). However, the present invention is not limited to the shunt resistor having such a configuration. As shown in FIG. 13A and FIG. 13B, the present invention can also use a shunt resistor 130e having the configuration where the connecting portions are arranged to be directed inward. That is, a first connecting portion 134e of the shunt resistor 130e may be connected to one end of a bridging portion 132e and may be formed in an extending manner in a direction toward the other end side from one end side of the bridging portion 132e (in a +x direction), while a second connecting portion 136e of the shunt resistor 130e may be connected to the other end of the bridging portion 132e and may be formed in an extending manner in a direction toward one end side from the other end side of the bridging portion 132e (in a −x direction).

With the use of the shunt resistor 130e having the configuration where the connecting portions are arranged to be directed inward, a shunt resistor mounting area can be saved by an amount of connecting portions and hence, it is possible to acquire a more compact mounting structure 100e for mounting a shunt resistor.

(6) With respect to the printed circuit boards in the respective embodiments, the case has been described where the printed circuit board is formed using a so-called DCB substrate. However, the printed circuit board is not limited to the DCB substrate, and other substrates can be also used for forming the printed circuit board provided that such substrates are made of a material which contains no organic substance.

This is because, with the use of such substrates, at the time of performing resin sealing of the printed circuit board (including the substrate) by transfer molding, adhesiveness between a transfer molding resin and the substrate can be increased compared to the case where a substrate containing organic substance is used for forming the printed circuit board. Another reason is that even when a mounting structure for mounting a shunt resistor generates heat when an electric current flows into the shunt resistor after resin sealing is performed, with the use of the substrate made of a material containing no organic substance, there is no possibility that an organic gas which is not desirable for a resin sealed power module is generated. In this manner, by forming the substrate using a material which does not contain an organic substance (made of an inorganic material), it is possible to suppress or avoid drawbacks described in the "Background Art". These drawbacks include: the expansion/shrinkage of the printed circuit board and the transfer molding resin due to rise and fall of a temperature of an operation environment or the generation of heat in the various electronic devices or the like; the concentration of a strain between the printed circuit board and the transfer molding resin due to a stress generated by such expansion/shrinkage; the generation of a gap between the printed circuit board and the resin; the generation of a gas from an organic substance contained in the substrate; and the intrusion of moisture or the like from the outside of the module or the like.

(7) The bonding material flow-out preventing resist 150 having a strip shape in the embodiment 1 has been described with respect to the example where the bonding material flow-out preventing resist 150 is disposed on the portion at the position where the first lead-out portion 113 has the second width W2 (see FIG. 1A). However, the present invention is not limited to such an example. For example, although not shown in the drawing, the bonding material flow-out preventing resist 150 may be disposed on a portion at a position on a more −x axial direction side than the above-mentioned position where the first lead-out portion 113 has the first width W1. That is, the bonding material flow-out preventing resist 150 may be disposed adjacently to a boundary where the width of the first lead-out portion 113 changes from the first width W1 to the second width W2.

(8) The bonding material flow-out preventing resist 150 according to the first embodiment is continuously disposed over an entire width of the first lead-out portion 113 in a y axis direction (see FIG. 1A). However, the present invention is not limited to such an arrangement. For example, although not shown in the drawing, the bonding material flow-out preventing resist 150 may be intermittently disposed on portions of the first lead-out portion 113 in the y axis direction. Even in the case where the bonding material flow-out preventing resist 150 is disposed intermittently, when the bonding material 140 spreads by wetting in a +x direction, spreading by wetting of the bonding material 140 is limited by the resist at portions where the bonding material flow-out preventing resist 150 exists. Further, spreading by wetting of the bonding material 140 is limited due to a surface tension of the bonding material 140 per se even at portions where the resist does not exist. Accordingly, spreading of a fillet of the bonding material 140 can be suppressed.

REFERENCE SIGNS LIST 100, 100a, 100b, 100c, 200, 300, 400, 500, 600, 900: mounting structure for mounting a shunt resistor
105, 205, 305, 405, 505, 605, 905: printed circuit board
107, 207, 307, 407, 507, 607, 907: substrate
110, 210, 310, 410, 510, 610, 760, 910: first conductive pattern
113, 213, 313, 413, 513, 613, 913: first lead-out portion
115, 215, 315, 415, 515, 615, 915: first pull-out portion
120, 220, 320, 420, 520, 620, 750, 920: second conductive pattern
123, 223, 323, 423, 523, 623, 923: second lead-out portion
125, 225, 325, 425, 525, 625, 925: second pull-out portion
130, 230, 330, 430, 530, 630, 730, 930: shunt resistor
132, 232, 332, 432, 532, 632, 732, 932: bridging portion
134, 234, 334, 434, 534, 634, 734, 934: first connecting portion
136, 236, 336, 436, 536, 636, 736, 936: second connecting portion
140, 240, 340, 440, 540, 640, 740, 940: bonding material
140a, 240a, 340a, 440a, 540a, 940a: fillet
150, 150a, 150b, 150c, 450, 450A, 550, 550A, 650: bonding material flow-out preventing resist
213b, 223b: portion having second thickness
313a, 323a: portion having second width
770: electronic devices
805: DCB substrate
807: ceramic substrate
850: copper pattern

The invention claimed is:

1. A mounting structure for mounting a shunt resistor comprising:
a printed circuit board where a first conductive pattern and a second conductive pattern are formed on at least one surface of a substrate in a spaced-apart manner from each other; and
a shunt resistor mounted on one surface of the printed circuit board with a bonding material made of a conductive material interposed therebetween, wherein the shunt resistor includes: a bridging portion spaced apart from the substrate; a first connecting portion continuously formed with one end of the bridging portion and electrically connected with the first conductive pattern with the bonding material interposed therebetween, and
a second connecting portion continuously formed with the other end of the bridging portion and electrically connected with the second conductive pattern with the bonding material interposed therebetween,
assuming an axis parallel to a predetermined direction extending from said one end to said the other end of the bridging portion as an x axis, a plane parallel to said one surface of the substrate as an xy plane, and an axis perpendicular to the x axis as a y axis, an axis parallel to a direction extending to said one surface of the substrate from the other surface of the substrate as a z axis, as viewed in a plan view of the xy plane,
the first conductive pattern includes:
a first lead-out portion led out in a +x direction from a first land region which is overlapped with the first connecting portion; and a first pull-out portion pulled out to the outside of a region of the bridging portion from a distal end portion of the first lead-out portion, the distal end portion of the first lead-out portion is a portion therein a side of the first lead-out portion farthest in the +x direction, and
the second conductive pattern includes:
a second lead-out portion led out in a −x direction from a second land region which is overlapped with the second connecting portion and spaced apart from the first lead-out portion; and a second pull-out portion pulled out to the outside of the region of the bridging portion from a distal end portion of the second lead-out portion, the distal end portion of the second lead-out portion is a portion therein a side of the second lead-out portion farthest in the −x direction, and
and a resistance value of the shunt resistor is detected between the first pull-out portion and the second pull-out portion, wherein
a bonding material flow-out preventing resist is disposed on a portion of a surface in/at +z direction side of at least one of the first lead-out portion and the second lead-out portion, and a fillet of the bonding material on the surface of at least one of the first lead-out portion and the second lead-out portion terminates at a position corresponding to a position where the bonding material flow-out preventing resist on the surface of at least one of the first lead-out portion and the second lead-out portion in/at +z direction side is disposed as viewed in cross section taken along an xz plane.

2. The mounting structure for mounting a shunt resistor according to claim 1, wherein the bonding material flow-out preventing resist is formed in a pattern formed in an elongated strip shape in a y axis direction as viewed in a plan view of the xy plane.

3. The mounting structure for mounting a shunt resistor according to claim 1, wherein the bonding material flow-out preventing resist has an L-shaped pattern as viewed in a plan view of the xy plane, and the bonding material flow-out preventing resist is disposed such that a crest of a bent portion of the L-shaped pattern is brought into contact with the bonding material.

4. The mounting structure for mounting a shunt resistor according to claim 1, wherein the bonding material flow-out preventing resist has a home-base-shape pattern as viewed in a plan view of the xy plane, and the bonding material flow-out preventing resist is disposed such that an acute-angled crest of the home-base pattern is brought into contact with the bonding material.

5. The mounting structure for mounting a shunt resistor according to claim 1, wherein the bonding material flow-out preventing resist has an elliptical or circular pattern in a plan view of the xy plane.

6. The mounting structure for mounting a shunt resistor according to claim 3, wherein a portion of the bonding material flow-out preventing resist is brought into contact with a lower surface of the first connecting portion or a lower surface of the second connecting portion of the shunt resistor in an overlapping manner.

7. The mounting structure for mounting a shunt resistor according to claim 4, wherein a portion of the bonding material flow-out preventing resist is brought into contact with a lower surface of the first connecting portion or a lower surface of the second connecting portion of the shunt resistor in an overlapping manner.

8. The mounting structure for mounting a shunt resistor according to claim 5, wherein a portion of the bonding material flow-out preventing resist is brought into contact with a lower surface of the first connecting portion or a lower surface of the second connecting portion of the shunt resistor in an overlapping manner.

9. A mounting structure for mounting a shunt resistor comprising:
  a printed circuit board where a first conductive pattern and a second conductive pattern are formed on at least one surface of a substrate in a spaced-apart manner from each other; and
  a shunt resistor mounted on one surface of the printed circuit board with a bonding material made of a conductive material interposed therebetween, wherein
  the shunt resistor includes: a bridging portion spaced apart from the substrate; a first connecting portion continuously formed with one end of the bridging portion and electrically connected with the first conductive pattern with the bonding material interposed therebetween, and a second connecting portion continuously formed with the other end of the bridging portion and electrically connected with the second conductive pattern with the bonding material interposed therebetween,
  assuming an axis parallel to a predetermined direction extending from said one end to said the other end of the bridging portion as an x axis, a plane parallel to said one surface of the substrate as an xy plane, and an axis perpendicular to the x axis as a y axis, an axis parallel to a direction extending to said one surface of the substrate from the other surface of the substrate as a z axis, as viewed in a plan view of the xy plane, the first conductive pattern includes: a first lead-out portion led out in a +x direction from a first land region which is overlapped with the first connecting portion; and a first pull-out portion pulled out to the outside of a region of the bridging portion from a distal end portion of the first lead-out portion, the distal end portion of the first lead-out portion is a portion therein a side of the first lead-out portion farthest in the +x direction, and the second conductive pattern includes: a second lead-out portion led out in a −x direction from a second land region which is overlapped with the second connecting portion and spaced apart from the first lead-out portion; and a second pull-out portion pulled out to the outside of the region of the bridging portion from a distal end portion of the second lead-out portion, the distal end portion of the second lead-out portion is a portion therein a side of the second lead-out portion farthest in the −x direction, and
  a resistance value of the shunt resistor is detected between the first pull-out portion and the second pull-out portion, wherein
  as viewed in a cross section taken along an xz plane, at least one of the first lead-out portion and the second lead-out portion has a portion where a thickness in a z axis direction changes from a first thickness to a second thickness smaller than the first thickness, and a fillet of the bonding material on the surface of at least one of the first lead-out portion and the second lead-out portion terminates at a position corresponding to a position of the portion where the first lead-out portion or/and the second lead-out portion has/have the second thickness.

10. A mounting structure for mounting a shunt resistor comprising:
  a printed circuit board where a first conductive pattern and a second conductive pattern are formed on at least one surface of a substrate in a spaced-apart manner from each other; and
  a shunt resistor mounted on one surface of the printed circuit board with a bonding material made of a conductive material interposed therebetween, wherein
  the shunt resistor includes: a bridging portion spaced apart from the substrate; a first connecting portion continuously formed with one end of the bridging portion and electrically connected with the first conductive pattern with the bonding material interposed therebetween, and a second connecting portion continuously formed with the other end of the bridging portion and electrically connected with the second conductive pattern with the bonding material interposed therebetween,
  assuming an axis parallel to a predetermined direction extending from said one end to said the other end of the bridging portion as an x axis, a plane parallel to said one surface of the substrate as an xy plane, and an axis perpendicular to the x axis as a y axis, an axis parallel to a direction extending to said one surface of the substrate from the other surface of the substrate as a z axis, as viewed in a plan view of the xy plane, the first conductive pattern includes: a first lead-out portion led out in a +x direction from a first land region which is overlapped with the first connecting portion; and a first pull-out portion pulled out to the outside of a region of the bridging portion from a distal end portion of the first lead-out portion, the distal end portion of the first lead-out portion is a portion therein a side of the first lead-out portion farthest in the +x direction, and the second conductive pattern includes: a second lead-out portion led out in a −x direction from a second land region which is overlapped with the second connecting portion and spaced apart from the first lead-out portion; and a second pull-out portion pulled out to the outside of the region of the bridging portion from a distal end portion of the second lead-out portion, the distal end portion of the second lead-out portion is a portion therein a side of the second lead-out portion farthest in the −x direction, and
  a resistance value of the shunt resistor is detected between the first pull-out portion and the second pull-out portion, wherein
  as viewed in a plan view of the xy plane, at least one of the first lead-out portion and the second lead-out portion has a portion where a width in a y axis direction changes from a first width to a second width narrower than the first width, and a fillet of the bonding material on the surface of at least one of the first lead-out portion and the second lead-out portion terminates at a position corresponding to a position of a portion where the first lead-out portion or/and the second lead-out portion has/have the second width as viewed in a cross section taken along an xz plane.

11. The mounting structure for mounting a shunt resistor according to claim 1, wherein as viewed in a plan view of the xy plane, the bonding material flow-out preventing resist is further provided outside a region which the shunt resistor occupies in the first conductive pattern or/and the second conductive pattern.

12. The mounting structure for mounting a shunt resistor according to claim 1, wherein as viewed in a plan view of the xy plane, the bonding material flow-out preventing resist is further provided outside a region which the shunt resistor occupies in the first conductive pattern or/and the second conductive pattern, and
  the bonding material flow-out preventing resist disposed inside the region which the shunt resistor occupies and the bonding material flow-out preventing resist disposed outside the region which the shunt resistor occupies are continuously formed with each other.

13. The mounting structure for mounting a shunt resistor according to claim 1, wherein the first connecting portion of the shunt resistor is continuously formed with said one end of the bridging portion, and is formed in an extending manner in a direction (−x direction) which is directed toward said one end side from said the other end side of the bridging portion, and the second connecting portion of the shunt resistor is continuously formed with said the other end of the bridging portion, and is formed in an extending manner in a direction (+x direction) which is directed toward said the other end side from said one end side of the bridging portion.

14. The mounting structure for mounting a shunt resistor according to claim 1, wherein the first connecting portion of the shunt resistor is continuously formed with said one end of the bridging portion, and is formed in an extending manner in a direction (+x direction) which is directed toward said the other end side from said one end side of the bridging portion, and the second connecting portion of the shunt resistor is continuously formed with said the other end of the bridging portion, and is formed in an extending manner in a direction (−x direction) which is directed toward said one end side from said the other end side of the bridging portion.

\* \* \* \* \*